United States Patent
Toyama

(10) Patent No.: US 10,944,036 B2
(45) Date of Patent: Mar. 9, 2021

(54) SEMICONDUCTOR LIGHT-EMITTING DEVICE

(71) Applicant: ROHM CO., LTD., Ukyo-ku Kyoto (JP)

(72) Inventor: Tomoichiro Toyama, Ukyo-ku Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 0 days.

(21) Appl. No.: 16/781,113

(22) Filed: Feb. 4, 2020

(65) Prior Publication Data

US 2020/0303610 A1 Sep. 24, 2020

(30) Foreign Application Priority Data

Mar. 18, 2019 (JP) .............................. JP2019-049416

(51) Int. Cl.
| | |
|---|---|
| *H01L 33/62* | (2010.01) |
| *H01L 33/48* | (2010.01) |
| *H01L 33/56* | (2010.01) |
| *H01L 23/00* | (2006.01) |

(52) U.S. Cl.
CPC .............. *H01L 33/62* (2013.01); *H01L 24/45* (2013.01); *H01L 33/486* (2013.01); *H01L 33/56* (2013.01)

(58) Field of Classification Search
CPC ....... H01L 33/62; H01L 33/486; H01L 24/45; H01L 33/56; H01L 33/52; H01L 25/0753
See application file for complete search history.

(56) References Cited

U.S. PATENT DOCUMENTS

| | | | | |
|---|---|---|---|---|
| 9,608,187 | B2* | 3/2017 | Mineshita | ............... H01L 33/22 |
| 2010/0072502 | A1* | 3/2010 | Kadotani | .............. H01L 33/642 |
| | | | | 257/98 |
| 2012/0056227 | A1* | 3/2012 | Lee | ........................ H01L 33/486 |
| | | | | 257/98 |
| 2012/0132938 | A1* | 5/2012 | Komatsu | ............... H01L 25/167 |
| | | | | 257/89 |

(Continued)

FOREIGN PATENT DOCUMENTS

WO 2015182272 A1 12/2015

*Primary Examiner* — Victor A Mandala
(74) *Attorney, Agent, or Firm* — Hamre, Schumann, Mueller & Larson, P.C.

(57) ABSTRACT

Semiconductor light-emitting device, includes: substrate having base and conductive part; first to third semiconductor light-emitting elements; first to third wires connected to the first to third semiconductor light-emitting elements respectively; and light-transmitting resin part covering the first to the third semiconductor light-emitting elements, wherein the base has main and rear surfaces facing opposite sides in thickness direction of the base, wherein the conductive part includes main surface part on the main surface, wherein the main surface part includes main surface first part where the first and second semiconductor light-emitting elements are mounted, wherein the main surface first part reaches both ends of the main surface in first direction perpendicular to the thickness direction, and wherein the main surface first part is separated from both the main surface part where the third semiconductor light-emitting element is mounted and the main surface part where the first, second, and third wires are connected.

17 Claims, 18 Drawing Sheets

(56) References Cited

U.S. PATENT DOCUMENTS

| | | | |
|---|---|---|---|
| 2013/0301257 A1* | 11/2013 | Britt | H01L 25/0753 |
| | | | 362/231 |
| 2013/0328074 A1* | 12/2013 | Lowes | H01L 33/54 |
| | | | 257/89 |
| 2015/0294959 A1* | 10/2015 | Lee | H01L 33/486 |
| | | | 257/89 |
| 2015/0349224 A1* | 12/2015 | Ichihara | H01L 25/0753 |
| | | | 257/89 |
| 2018/0175255 A1* | 6/2018 | Morikawa | G02F 1/133603 |
| 2019/0067256 A1* | 2/2019 | Kurimoto | H01L 33/44 |
| 2019/0165233 A1* | 5/2019 | Horikawa | H01L 33/62 |
| 2020/0161520 A1* | 5/2020 | Hugon | H01L 33/62 |

* cited by examiner

SEMICONDUCTOR LIGHT-EMITTING DEVICE

CROSS-REFERENCE TO RELATED APPLICATION

This application is based upon and claims the benefit of priority from Japanese Patent Application No. 2019-049416, filed on Mar. 18, 2019, the entire contents of which are incorporated herein by reference.

TECHNICAL FIELD

The present disclosure relates to a semiconductor light-emitting device.

BACKGROUND

Semiconductor light-emitting devices having semiconductor light-emitting elements as light sources have been proposed. In the related art, an example of a semiconductor light-emitting device is disclosed. The semiconductor light-emitting device disclosed in the related art includes a plurality of LED chips as semiconductor light-emitting elements, a substrate on which the LED chips are mounted, and a light-transmitting resin part that covers the LED chips.

When a plurality of LED chips that emit, for example, red light, green light, and blue light are employed, the size of the semiconductor light-emitting device may be increased and a defect in manufacture may be caused by the arrangement of the plurality of LED chips.

SUMMARY

Some embodiments of the present disclosure provide a semiconductor light-emitting device that can be miniaturized.

According to one embodiment of the present disclosure, there is provided a semiconductor light-emitting device. The semiconductor light-emitting device includes: a substrate having a base and a conductive part; a first semiconductor light-emitting element, a second semiconductor light-emitting element, and a third semiconductor light-emitting element supported by the substrate; at least one first wire connected to the first semiconductor light-emitting element, at least one second wire connected to the second semiconductor light-emitting element, and a third wire connected to the third semiconductor light-emitting element; and a light-transmitting resin part covering the first semiconductor light-emitting element, the second semiconductor light-emitting element, and the third semiconductor light-emitting element, wherein the base has a main surface and a rear surface facing opposite sides to each other in a thickness direction of the base, wherein the conductive part includes a main surface part formed on the main surface, wherein the main surface part includes a main surface first part on which the first semiconductor light-emitting element and the second semiconductor light-emitting element are mounted, wherein the main surface first part reaches both ends of the main surface in a first direction perpendicular to the thickness direction of the base, and wherein the main surface first part is separated from both a part of the main surface part on which the third semiconductor light-emitting element is mounted and a part of the main surface part to which the at least one first wire, the at least one second wire, and the third wire are connected.

Other features and advantages of the present disclosure will become more apparent from the detailed description given below with reference to the accompanying drawings.

DETAILED DESCRIPTION

Figure 1:
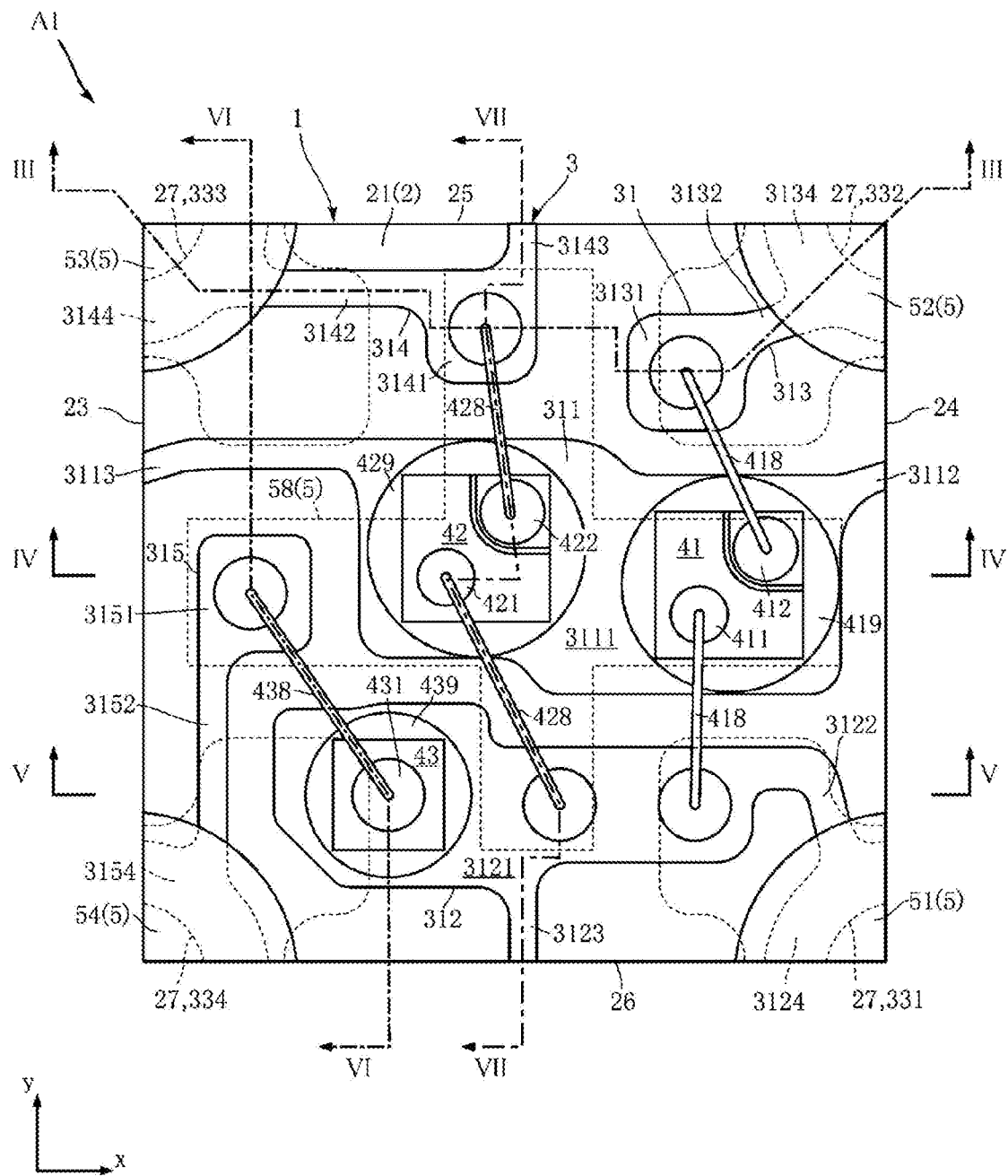
FIG. 1 is a plan view of a principal part illustrating a semiconductor light-emitting device according to a first embodiment of the present disclosure.

Embodiments of the present disclosure will now be described in detail with reference to the drawings.

The terms "first," "second," "third," and the like herein are simply used as labels, and are not necessarily intended to be ordered for target objects.

First Embodiment

FIGS. 1 to 9 illustrate a semiconductor light-emitting device according to a first embodiment of the present disclosure. A semiconductor light-emitting device A1 of the present embodiment includes a substrate 1, a first semiconductor light-emitting element 41, a second semiconductor light-emitting element 42, a third semiconductor light-emitting element 43, two first wires 418, two second wires 428, a third wire 438, and a light-transmitting resin part 6. The semiconductor light-emitting device A1 is configured as a light-emitting device capable of appropriately emitting red light, green light, and blue light.

Figure 2:
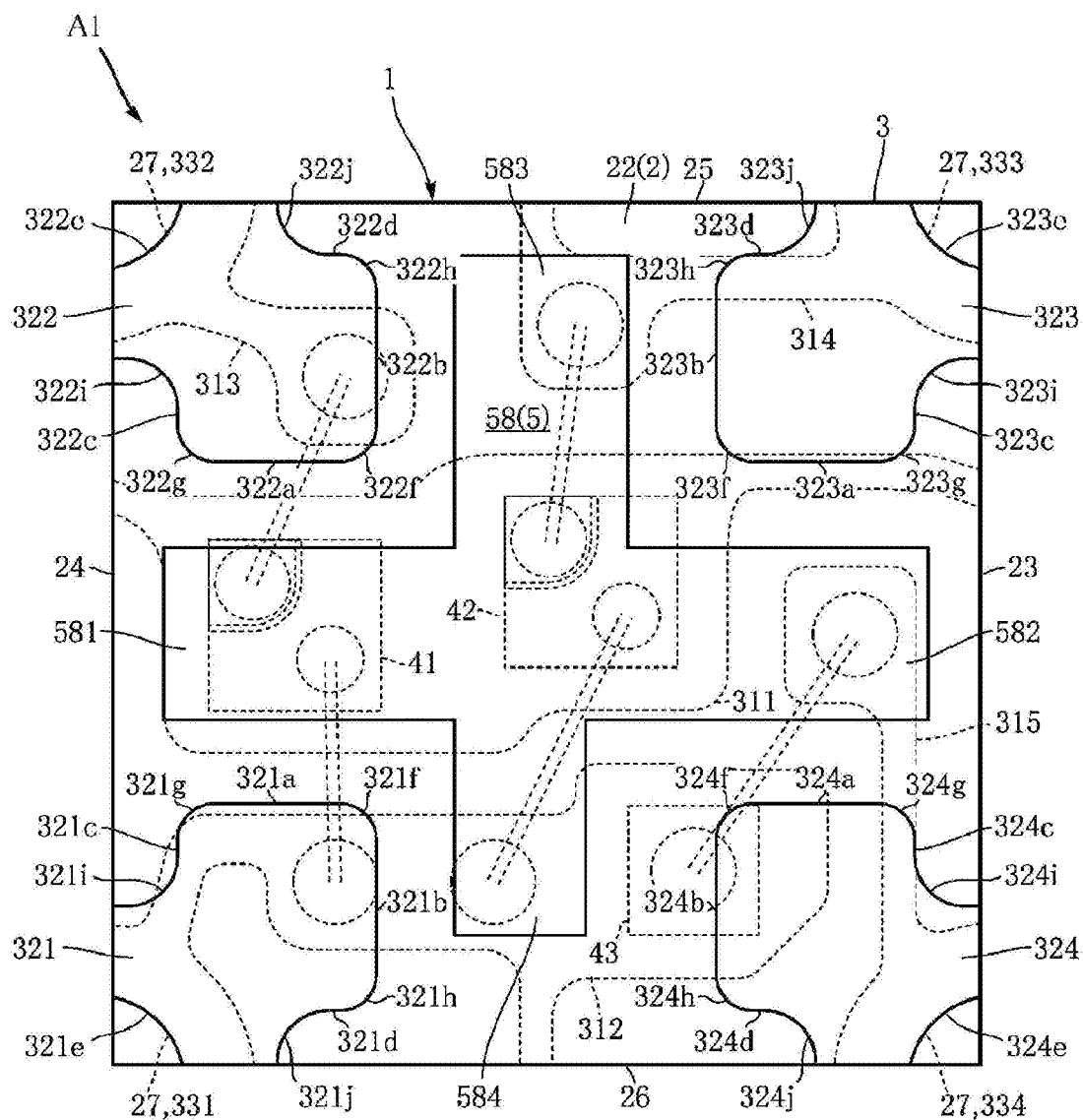
FIG. 2 is a bottom view illustrating the semiconductor light-emitting device according to the first embodiment of the present disclosure.
Figure 3:
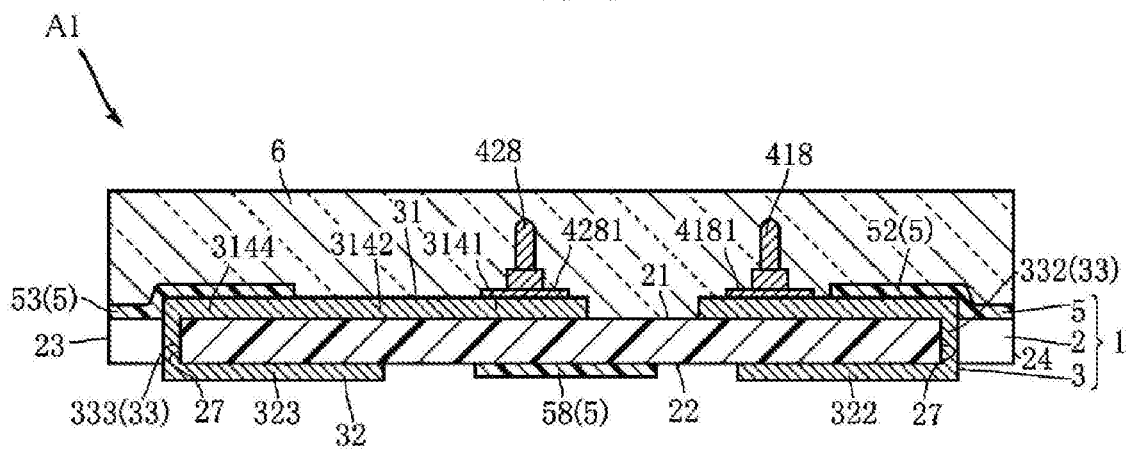
FIG. 3 is a cross-sectional view taken along a line III-III in FIG. 1.
Figure 4:
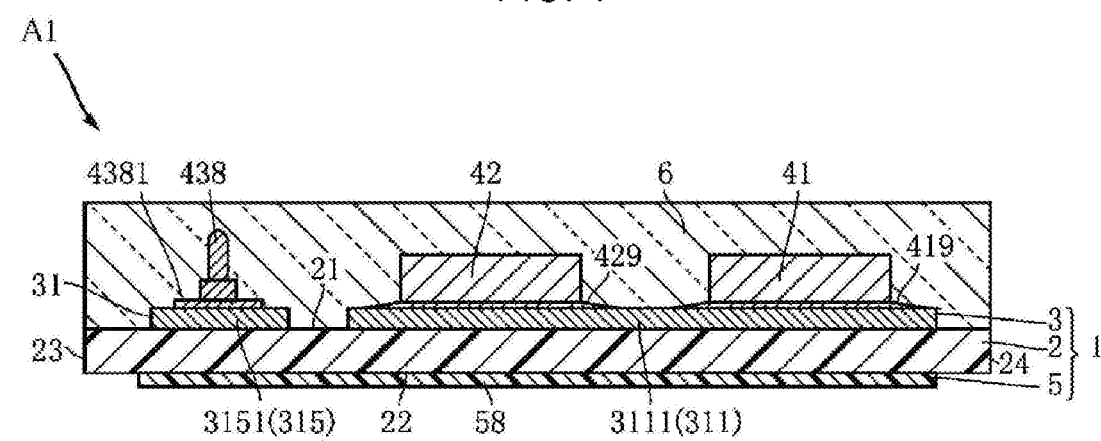
FIG. 4 is a cross-sectional view taken along a line IV-IV in FIG. 1.
Figure 5:
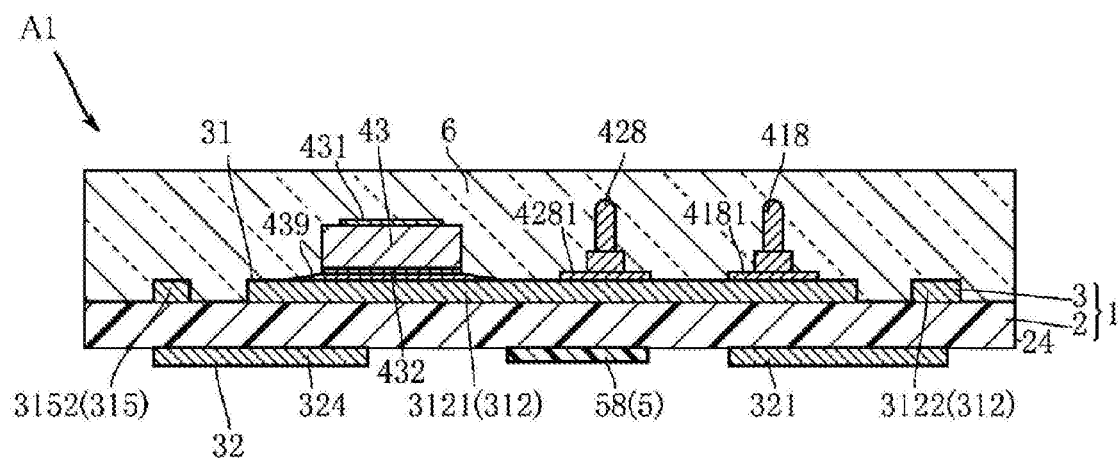
FIG. 5 is a cross-sectional view taken along a line V-V in FIG. 1.
Figure 6:
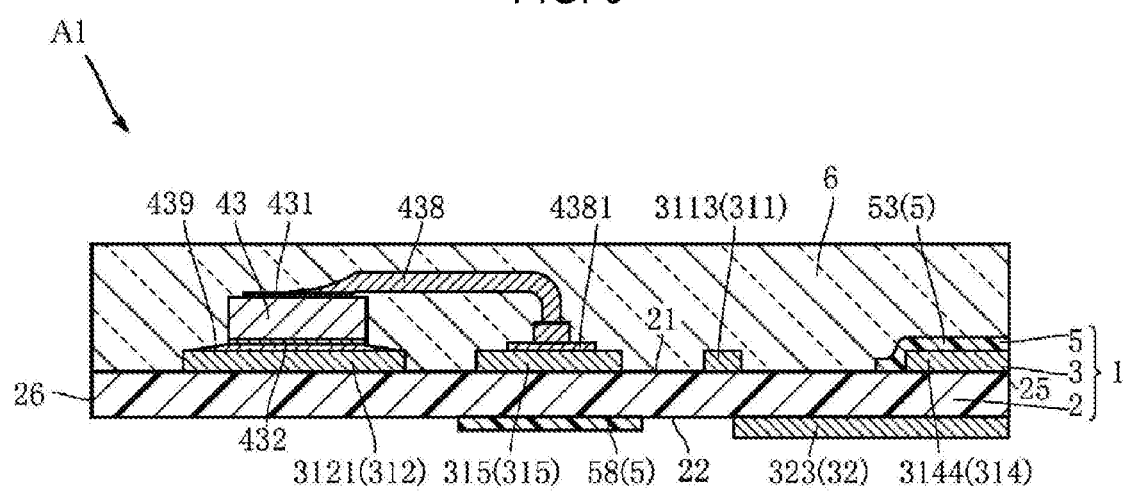
FIG. 6 is a cross-sectional view taken along a line VI-VI in FIG. 1.
Figure 7:
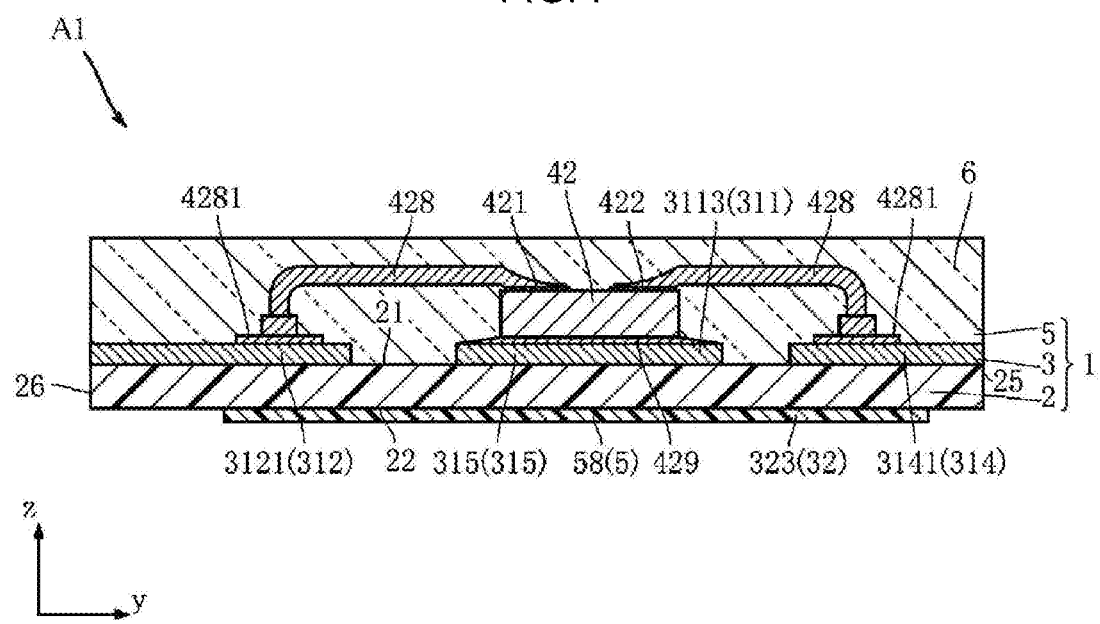
FIG. 7 is a cross-sectional view taken along a line VII-VII in FIG. 1.
Figure 8:
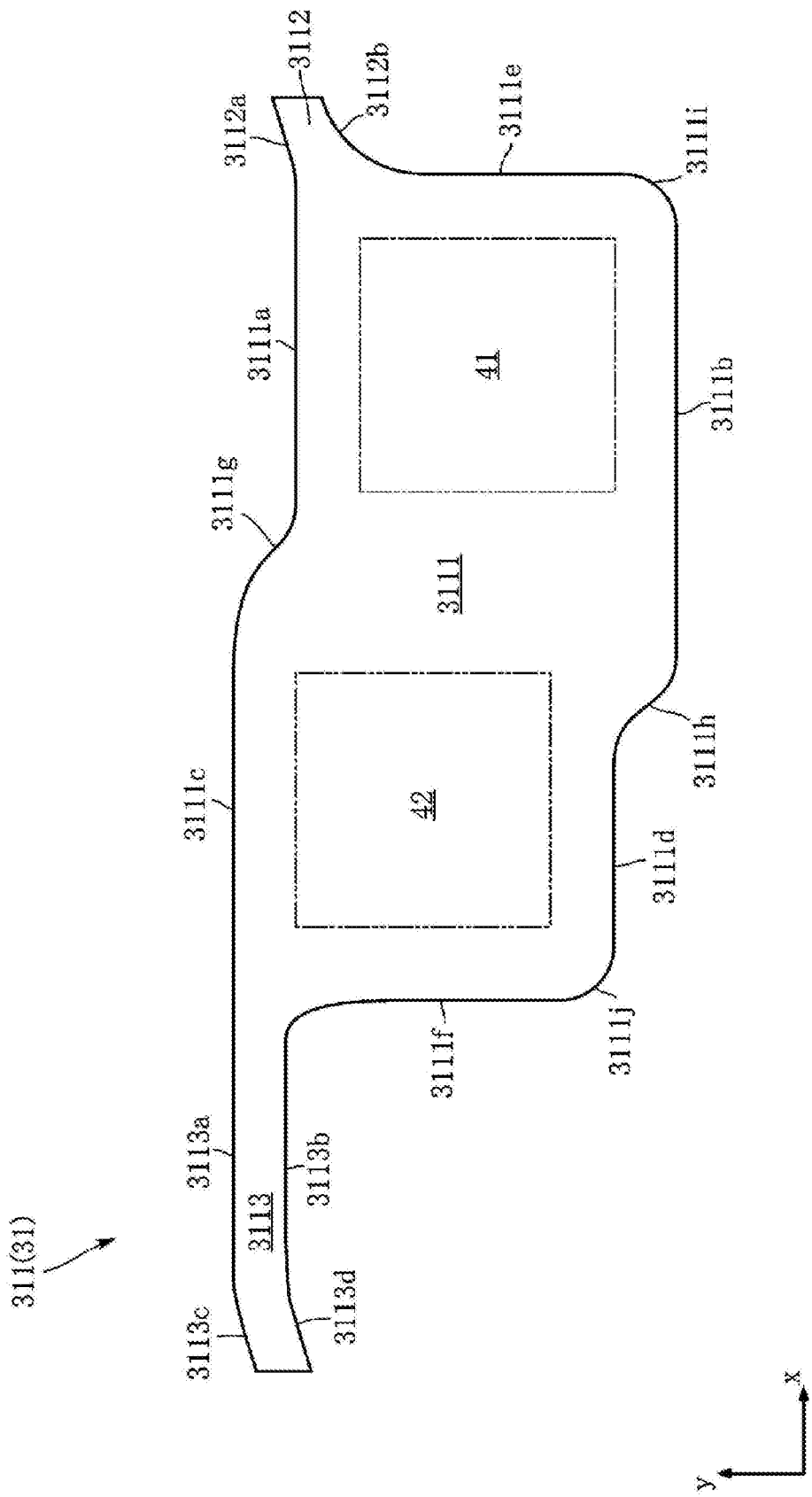
FIG. 8 is a plan view illustrating a main surface first part of the semiconductor light-emitting device according to the first embodiment of the present disclosure.
Figure 9:
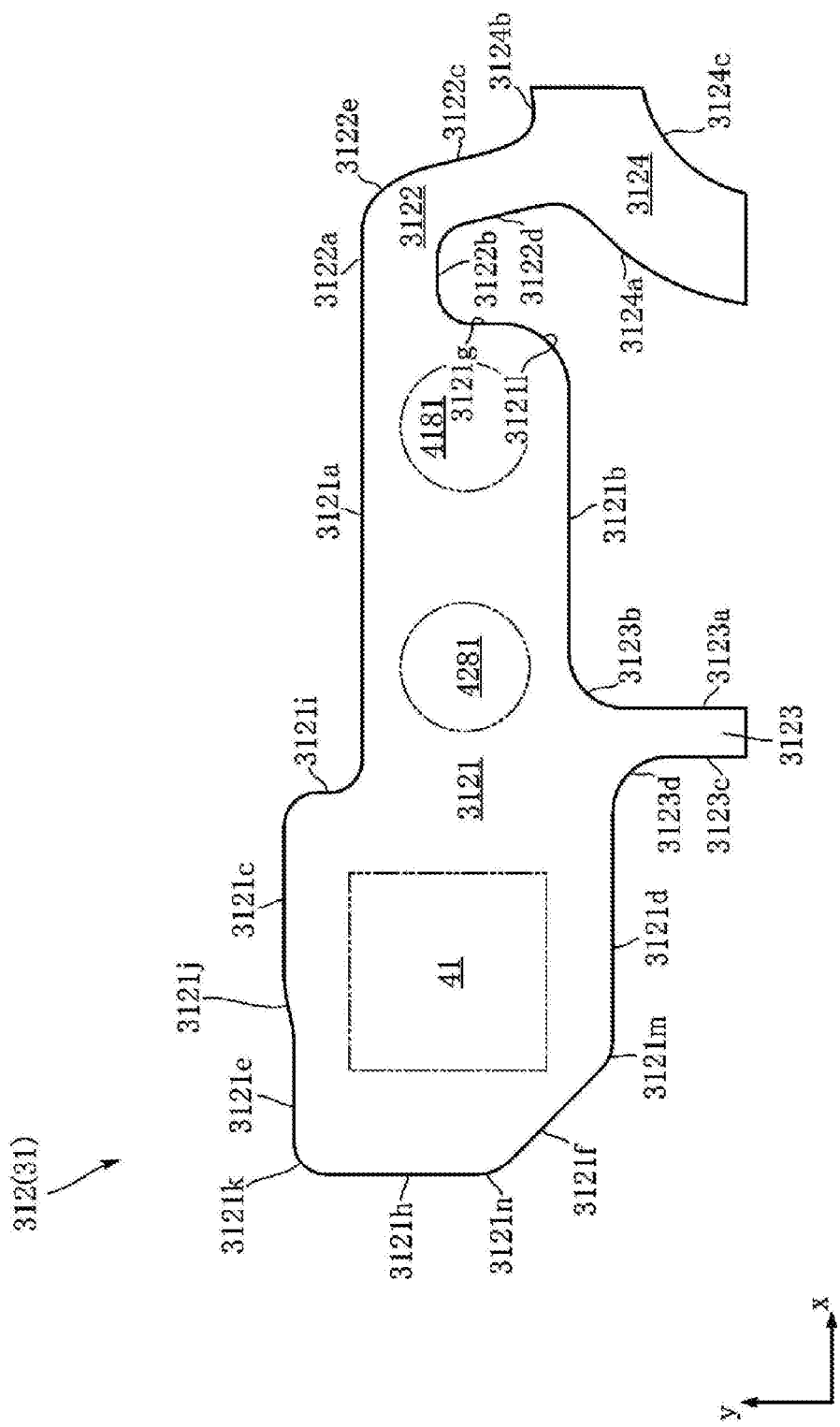
FIG. 9 is a plan view illustrating a main surface second part of the semiconductor light-emitting device according to the first embodiment of the present disclosure.

FIG. 1 is a plan view of a principal part illustrating the semiconductor light-emitting device A1. FIG. 2 is a bottom view illustrating the semiconductor light-emitting device A1. FIG. 3 is a cross-sectional view taken along a line III-III in FIG. 1. FIG. 4 is a cross-sectional view taken along a line IV-IV in FIG. 1. FIG. 5 is a cross-sectional view taken along a line V-V in FIG. 1. FIG. 6 is a cross-sectional view taken along a line VI-VI in FIG. 1. FIG. 7 is a cross-sectional view taken along a line VII-VII in FIG. 1. FIG. 8 is a plan view illustrating a main surface first part of the semiconductor light-emitting device A1. FIG. 9 is a plan view illustrating a main surface second part of the semiconductor light-emitting device A1. In these drawings, the lower side in the plan view may be referred to as "one side in the y direction" and the upper side in the plan view may be referred to as "the other side in they direction." Further, the left side in the plan view may be referred to as "one side in the x direction" and the right side in the plan view may be referred to as "the other side in the x direction." Moreover, in FIG. 1, the light-transmitting resin part 6 is omitted for convenience of understanding.

The size and shape of the semiconductor light-emitting device A1 are not limited at all. For example, the dimension in the x direction and the dimension in the y direction are each about 1.0 mm as the size of the semiconductor light-emitting device A1.

<Substrate 1>

The substrate 1 serves as a base of the semiconductor light-emitting device A1. The substrate 1 includes a base 2, a conductive part 3, and an insulating layer 5.

<Base 2>

The base 2 is made of an insulating material. The insulating material constituting the base 2 is not limited at all, and may be, for example, a glass epoxy resin or the like. The base 2 includes a main surface 21, a rear surface 22, a first surface 23, a second surface 24, a third surface 25, a fourth surface 26, and a plurality of groove parts 27.

As illustrated in FIGS. 1 to 7, the main surface 21 and the rear surface 22 face opposite sides to each other in a z direction. In the illustrated example, the main surface 21 and the rear surface 22 are planes perpendicular to the z direction. The shape of the base 2 is not particularly limited, and is, for example, rectangular, as viewed in the z direction, as illustrated in FIGS. 1 and 2. The thickness of the base 2 is, for example, about 0.2 mm.

The first surface 23 is a surface facing the x direction, and is connected to the main surface 21 and the rear surface 22. The second surface 24 is a surface facing the opposite side of the first surface 23 in the x direction, and is connected to the main surface 21 and the rear surface 22. The third surface 25 is a surface facing the y direction, and is connected to the main surface 21 and the rear surface 22. The fourth surface 26 is a surface facing the opposite side of the third surface 25 in the y direction, and is connected to the main surface 21 and the rear surface 22.

The plurality of groove parts 27 are installed at the corners of the base 2 as viewed in the z direction. The groove parts 27 each extend along the z direction and reach the main surface 21 and the rear surface 22. In the illustrated example, the groove parts 27 each have a quarter arc shape as viewed in the z direction.

<Conductive Part 3>

The conductive part 3 is formed on the base 2, and provides a conduction path to the first semiconductor light-emitting element 41, the second semiconductor light-emitting element 42, and the third semiconductor light-emitting element 43, as well as a part for mounting the first semiconductor light-emitting element 41, and the second semiconductor light-emitting element 42, and the third semiconductor light-emitting element 43. The conductive part 3 is made of a conductive material, and is made of a metal such as Cu, Ni, Pd, Ti, Au, or the like. A configuration in which a Cu plating layer is formed in an underlying plating layer, which is formed on the base 2 and made of Ti and Cu, by electrolytic plating may be used as a configuration example of the conductive part 3.

In the present embodiment, as illustrated in FIGS. 1 to 7, the conductive part 3 includes a main surface part 31, a rear surface part 32, and a plurality of connection parts 33.

The main surface part 31 is formed on the main surface 21 of the base 2. In the illustrated example, the main surface part 31 includes a main surface first part 311, a main surface second part 312, a main surface third part 313, a main surface fourth part 314, and a main surface fifth part 315. The thickness of the main surface part 31 is not particularly limited, and is, for example, about 40 μm.

The main surface first part 311 includes a pad part 3111, a first extension part 3112, and a second extension part 3113, as illustrated in FIGS. 1 and 8. As will be described in detail below, the main surface first part 311 reaches both ends of the main surface 21 of the base 2 in the x direction. Further, the main surface first part 311 is separated from any other part of the main surface part 31.

The pad part 3111 is a part on which the first semiconductor light-emitting element 41 and the second semiconductor light-emitting element 42 are mounted. In the illustrated example, the pad part 3111 includes a first side 3111a, a second side 3111b, a third side 3111c, a fourth side 3111d, a fifth side 3111e, a sixth side 3111f, a seventh side 3111g, an eighth side 3111h, a ninth side 3111i, a tenth side 3111j, and an eleventh side 3111k, as illustrated in FIG. 8. In FIG. 8, the first semiconductor light-emitting element 41 and the second semiconductor light-emitting element 42 are indicated by imaginary lines.

The first side 3111a is a side extending along the x direction. The second side 3111b is a side extending along the x direction, and is located on one side of the first side 3111a in the y direction. The third side 3111c is a side extending along the x direction. The third side 3111c is located on one side of the first side 3111a in the x direction, and is located on the other side thereof in they direction. The fourth side 3111d is a side extending along the x direction. The fourth side 3111d is located on one side of the second side 3111b in the x direction, and is located on the other side thereof in the y direction.

The fifth side 3111e is a side extending along the y direction, and is located between the first side 3111a and the second side 3111*b* in the y direction. The sixth side 3111*f* is a side extending along the y direction. The sixth side 3111*f* is located on one side of the fifth side 3111*e* in the x direction. The sixth side 3111*f* is located between the third side 3111*c* and the fourth side 3111*d* in the y direction.

The seventh side 3111*g* is interposed between the first side 3111*a* and the third side 3111*c*, and connects them. In the illustrated example, the seventh side 3111*g* is an S-shaped curve. The eighth side 3111*h* is interposed between the second side 3111*b* and the fourth side 3111*d*, and connects them. In the illustrated example, the eighth side 3111*h* is an S-shaped curve.

The ninth side 3111*i* is interposed between the fifth side 3111*e* and the second side 3111*b*, and connects them. In the illustrated example, the ninth side 3111*i* has a convex curve shape. The tenth side 3111*j* is interposed between the fourth side 3111*d* and the sixth side 3111*f*, and connects them. In the illustrated example, the tenth side 3111*j* has a convex curve shape.

The first extension part 3112 extends from the pad part 3111 to the other side thereof in the x direction, and reaches an end edge (second surface 24) of the main surface 21 in the x direction. In the illustrated example, the first extension part 3112 includes a first side 3112*a* and a second side 3112*b*, as illustrated in FIG. 8.

The first side 3112*a* is a side on the other side of the first extension part 3112 in the y direction. In the illustrated example, the first side 3112*a* has a shape that is inclined with respect to the x direction. The second side 3112*b* is a side on one side of the first extension part 3112 in the y direction. In the illustrated example, the second side 3112*b* has a concave curve shape.

The second extension part 3113 extends from the pad part 3111 to one side thereof in the x direction, and reaches an end edge (first surface 23) of the main surface 21 in the x direction. In the illustrated example, the second extension part 3113 includes a first side 3113*a*, a second side 3113*b*, a third side 3113*c*, and a fourth side 3113*d*, as illustrated in FIG. 8.

The first side 3112*a* is a side on the other side of the second extension part 3113 in the y direction. In the illustrated example, the first side 3113*a* has a shape along the x direction. The second side 3113*b* is a side on one side of the second extension part 3113 in the y direction. In the illustrated example, the second side 3113*b* has a shape along the x direction. The third side 3113*c* is connected to one side of the first side 3113*a* in the x direction, and reaches the end edge (first surface 23) of the main surface 21 in the x direction. In the illustrated example, the third side 3113*c* has a shape that is inclined with respect to the x direction. The fourth side 3113*d* is connected to one side of the second side 3113*b* in the x direction, and reaches the end edge (first surface 23) of the main surface 21 in the x direction. In the illustrated example, the fourth side 3113*d* has a shape that is inclined with respect to the x direction.

The main surface second part 312 is located on one side of the first semiconductor light-emitting element 41 and the second semiconductor light-emitting element 42 in the y direction, and is separated from the main surface first part 311. As illustrated in FIGS. 1 and 9, the main surface second part 312 includes a pad part 3121, a first extension part 3122, a second extension part 3123, and an edge part 3124.

The pad part 3121 is a part on which the third semiconductor light-emitting element 43 is mounted. Further, in the present embodiment, the first wire 418 and the second wire 428 are connected to the pad part 3121. In FIG. 9, the third semiconductor light-emitting element 43, and a bonding part 4181 and a bonding part 4281 as described later are indicated by imaginary lines.

In the illustrated example, the pad part 3121 includes a first side 3121*a*, a second side 3121*b*, a third side 3121*c*, a fourth side 3121*d*, a fifth side 3121*e*, a sixth side 3121*f*, a seventh side 3121*g*, an eighth side 3121*h*, a ninth side 3121*i*, a tenth side 3121*j*, an eleventh side 3121*k*, a twelfth side 3121*l*, a thirteenth side 3121*m*, and a fourteenth side 3121*n*, as illustrated in FIG. 9.

The first side 3121*a* is a side extending along the x direction. The second side 3121*b* is a side extending along the x direction, and is located on one side of the first side 3121*a* in the y direction. The third side 3121*c* is a side extending along the x direction. The third side 3121*c* is located on one side of the first side 3121*a* in the x direction, and is located on the other side thereof in the y direction. The fourth side 3121*d* is a side extending along the x direction, and is located on one side of the third side 3121*c* in the y direction. The fourth side 3121*d* is located on one side of the second side 3121*b* in the x direction, and is located on one side thereof in the y direction. The fifth side 3121*e* is a side extending along the x direction. The fifth side 3121*e* is located on one side of the third side 3121*c* in the x direction, and is located on one side thereof in the y direction. Also, the fifth side 3121*e* is located on the other side of the first side 3121*a* in the y direction. The sixth side 3121*f* is a side inclined to the x direction. The sixth side 3121*f* is located on one side of the fourth side 3121*d* in the x direction. Also, the sixth side 3121*f* is located between the fifth side 3121*e* and the fourth side 3121*d* in the y direction.

The seventh side 3121*g* is a side extending along the y direction. The seventh side 3121*g* is located between the first side 3121*a* and the second side 3121*b* in the y direction. The eighth side 3121*h* is a side extending along the y direction. The eighth side 3121*h* is located between the fifth side 3121*e* and the sixth side 3121*f* in the y direction.

The ninth side 3121*i* is interposed between the first side 3121*a* and the third side 3121*c*, and connects them. In the illustrated example, the ninth side 3121*i* is an S-shaped curve. The tenth side 3121*j* is interposed between the third side 3121*c* and the fifth side 3121*e*, and connects them. In the illustrated example, the tenth side 3121*j* is an S-shaped curve.

The eleventh side 3121*k* is interposed between the fifth side 3121*e* and the eighth side 3121*h*, and connects them. In the illustrated example, the eleventh side 3121*k* has a convex curve shape. The twelfth side 3121*l* is interposed between the seventh side 3121*g* and the second side 3121*b*, and connects them. In the illustrated example, the twelfth side 3121*l* has a convex curve shape. The thirteenth side 3121*m* is interposed between the fourth side 3121*d* and the sixth side 3121*f*, and connects them. In the illustrated example, the thirteenth side 3121*m* has a convex curve shape. The fourteenth side 3121*n* is interposed between the sixth side 3121*f* and the eighth side 3121*h*, and connects them. In the illustrated example, the fourteenth side 3121*n* has a convex curve shape.

The first extension part 3122 extends from the other side part of the pad part 3121 in the x direction, as illustrated in FIG. 9. In the illustrated example, the first extension part 3122 includes a first side 3122*a*, a second side 3122*b*, a third side 3122*c*, a fourth side 3122*d*, and a fifth side 3122*e*.

The first side 3122*a* is a side extending along the x direction. In the illustrated example, the first side 3122*a* is connected to the first side 3121*a* of the pad part 3121. The second side 3122*b* is located on one side of the first side 3122*a* in the y direction. In the illustrated example, the second side 3122*b* is connected to the seventh side 3121*g* of the pad part 3121. The third side 3122*c* is located on the other side of the first side 3122*a* in the x direction, and is inclined with respect to the x direction. The fourth side 3122*d* is located on the other side of the second side 3122*b* in the x direction, and is inclined with respect to the x direction. The fifth side 3122*e* is interposed between the first side 3122*a* and the third side 3122*c*, and connects them.

The second extension part 3123 extends from one side part of the pad part 3121 in the y direction, and reaches an end edge (fourth surface 26) of the main surface 21 in the y direction, as illustrated in FIGS. 1 and 9. As illustrated in FIG. 9, in the illustrated example, the second extension part 3123 has a first side 3123*a*, a second side 3123*b*, a third side 3123*c*, and a fourth side 3123*d*.

The first side 3123*a* extends along the y direction and reaches the end edge (fourth surface 26) of the main surface 21 in the y direction. The third side 3123*c* extends along the y direction, and is located on one side of the second extension part 3123 in the x direction. The third side 3123*c* reaches the end edge (fourth surface 26) of the main surface 21 in the y direction. The second side 3123*b* is interposed between the first side 3123*a* and the second side 3121*b* of the pad part 3121, and connects them. In the illustrated example, the second side 3123*b* has a concave curve shape. The fourth side 3123*d* is interposed between the third side 3123*c* and the fourth side 3121*d* of the pad part 3121, and connects them. In the illustrated example, the fourth side 3123*d* has a concave curve shape.

As illustrated in FIGS. 1 and 9, the edge part 3124 is connected to the first extension part 3122, and has a shape along the groove part 27 of the base 2 as viewed in the z direction. As illustrated in FIG. 9, in the illustrated example, the edge part 3124 has a first side 3124*a*, a second side 3124*b*, and a third side 3124*c*.

The first side 3124*a* has a convex arc shape, and is installed at a position facing the twelfth side 3121*l* of the pad part 3121 in the illustrated example. The second side 3124*b* has a convex arc shape, and is installed on the opposite side of the first side 3124*a* with the first extension part 3122 interposed therebetween. The first side 3124*a* and the second side 3124*b* have a relationship that forms the same arc when they are each extended. The third side 3124*c* has a concave arc shape. The third side 3124*c* is installed near the groove part 27 with respect to the first side 3124*a* and the second side 3124*b*.

The main surface third part 313 includes a pad part 3131, a first extension part 3132, and an edge part 3134, as illustrated in FIG. 1.

The pad part 3131 is arranged separately from the pad part 3111 of the main surface first part 311 on the other side thereof in the y direction. The shape of the pad part 3131 is not particularly limited, and is substantially rectangular in the illustrated example. The first wire 418 is connected to the pad part 3131.

The first extension part 3132 extends from the pad part 3131 toward the groove part 27. The edge part 3134 is connected to the first extension part 3132, and has a shape along the groove part 27 of the base as viewed in the z direction.

The main surface fourth part 314 includes a pad part 3141, a first extension part 3142, a main surface fourth part 3143, and an edge part 3144, as illustrated in FIG. 1.

The pad part 3141 is arranged separately from the pad part 3111 of the main surface first part 311 on the other side thereof in the y direction, and is arranged separately from the pad part 3131 of the main surface third part 313 on one side thereof in the x direction. The shape of the pad part 3141 is not particularly limited, and is substantially rectangular in the illustrated example. The second wire 428 is connected to the pad part 3141.

The first extension part 3142 extends from the pad part 3141 toward the groove part 27. The main surface fourth part 3143 extends from the pad part 3131 to the other side thereof in the y direction, and reaches an end edge (third surface 25) of the main surface 21 in the y direction. The edge part 3144 is connected to the first extension part 3142, and has a shape along the groove part 27 of the base as viewed in the z direction.

The main surface fifth part 315 includes a pad part 3151, a first extension part 3152, and an edge part 3154, as illustrated in FIG. 1.

The pad part 3151 is arranged separately from the pad part 3111 of the main surface first part 311 on one side thereof in the x direction. The shape of the pad part 3151 is not particularly limited, and is substantially rectangular in the illustrated example. The third wire 438 is connected to the pad part 3151.

The first extension part 3152 extends from the pad part 3151 to one side thereof in the y direction, and extends toward the groove part 27. The edge part 3154 is connected to the first extension part 3152 and has a shape along the groove part 27 of the base as viewed in the z direction.

The rear surface part 32 is formed on the main surface 21 of the base 2, as illustrated in FIG. 2. In the illustrated example, the rear surface part 32 includes a rear surface first part 321, a rear surface second part 322, a rear surface third part 323, and a rear surface fourth part 324. The thickness of the rear surface part 32 is not particularly limited, and is, for example, about 40 μm. Further, for example, solder plating or Sn plating may be formed on the surface layer of the rear surface part 32.

The rear surface first part 321 overlaps the main surface second part 312 of the main surface part 31 as viewed in the z direction. In the illustrated example, the rear surface first part 321 includes a first side 321*a*, a second side 321*b*, a third side 321*c*, a fourth side 321*d*, a fifth side 321*e*, a sixth side 321*f*, a seventh side 321*g*, an eighth side 321*h*, a ninth side 321*i*, and a tenth side 321*j*.

The first side 321*a* extends along the x direction. The second side 321*b* extends along the y direction. The third side 321*c* extends along the y direction and is located on the other side of the second side 321*b* in the x direction. The fourth side 321*d* extends along the x direction and is located on one side of the first side 321*a* in the y direction. The fifth side 321*e* has an arc shape along the groove part 27 of the base 2. The sixth side 321*f* is interposed between the first side 321*a* and the second side 321*b*, and connects them. In the illustrated example, the sixth side 321*f* has a convex curve shape. The seventh side 321*g* is interposed between the first side 321*a* and the third side 321*c*, and connects them. In the illustrated example, the seventh side 321*g* has a convex curve shape. The eighth side 321*h* is interposed between the second side 321*b* and the fourth side 321*d*, and connects them. In the illustrated example, the eighth side 321*h* has a convex curve shape. The ninth side 321*i* is connected to the third side 321*c* and reaches the other side end (second surface 24) of the rear surface 22 in the x direction. In the illustrated example, the ninth side 321*i* has a concave curve shape. The tenth side 321*j* is connected to the fourth side 321*d* and reaches one side end (fourth surface 26) of the rear surface 22 in the y direction. In the illustrated example, the tenth side 321*j* has a concave curve shape.

The rear surface second part 322 overlaps the main surface third part 313 of the main surface part 31 as viewed in the z direction. In the illustrated example, the rear surface second part 322 includes a first side 322a, a second side 322b, a third side 322c, a fourth side 322d, a fifth side 322e, a sixth side 322f, a seventh side 322g, an eighth side 322h, a ninth side 322i, and a tenth side 322j.

The first side 322a extends along the x direction. The second side 322b extends along the y direction. The third side 322c extends along the y direction and is located on the other side of the second side 322b in the x direction. The fourth side 322d extends along the x direction and is located on the other side of the first side 322a in they direction. The fifth side 322e has an arc shape along the groove part 27 of the base 2. The sixth side 322f is interposed between the first side 322a and the second side 322b, and connects them. In the illustrated example, the sixth side 322f has a convex curve shape. The seventh side 322g is interposed between the first side 322a and the third side 322c, and connects them. In the illustrated example, the seventh side 322g has a convex curve shape. The eighth side 322h is interposed between the second side 322b and the fourth side 322d, and connects them. In the illustrated example, the eighth side 322h has a convex curve shape. The ninth side 322i is connected to the third side 322c and reaches the other side end (second surface 24) of the rear surface 22 in the x direction. In the illustrated example, the ninth side 322i has a concave curve shape. The tenth side 322j is connected to the fourth side 322d and reaches the other side end (third surface 25) of the rear surface 22 in the y direction. In the illustrated example, the tenth side 322j has a concave curve shape.

The rear surface third part 323 overlaps the main surface fourth part 314 of the main surface part 31 as viewed in the z direction. In the illustrated example, the rear surface third part 323 includes a first side 323a, a second side 323b, a third side 323c, a fourth side 323d, a fifth side 323e, a sixth side 323f, a seventh side 323g, an eighth side 323h, a ninth side 323i, and a tenth side 323j.

The first side 323a extends along the x direction. The second side 323b extends along the y direction. The third side 323c extends along the y direction and is located on one side of the second side 323b in the x direction. The fourth side 323d extends along the x direction and is located on one side of the first side 323a in they direction. The fifth side 323e has an arc shape along the groove part 27 of the base 2. The sixth side 323f is interposed between the first side 323a and the second side 323b, and connects them. In the illustrated example, the sixth side 323f has a convex curve shape. The seventh side 323g is interposed between the first side 323a and the third side 323c, and connects them. In the illustrated example, the seventh side 323g has a convex curve shape. The eighth side 323h is interposed between the second side 323b and the fourth side 323d, and connects them. In the illustrated example, the eighth side 323h has a convex curve shape. The ninth side 323i is connected to the third side 323c and reaches one side end (first surface 23) of the rear surface 22 in the x direction. In the illustrated example, the ninth side 323i has a concave curve shape. The tenth side 323j is connected to the fourth side 323d and reaches the other side end (third surface 25) of the rear surface 22 in the y direction. In the illustrated example, the tenth side 323j has a concave curve shape.

The rear surface fourth part 324 overlaps the main surface fifth part 315 of the main surface part 31 as viewed in the z direction. In the illustrated example, the rear surface fourth part 324 includes a first side 324a, a second side 324b, a third side 324c, a fourth side 324d, a fifth side 324e, a sixth side 324f, a seventh side 324g, an eighth side 324h, a ninth side 324i, and a tenth side 324j.

The first side 324a extends along the x direction. The second side 324b extends along the y direction. The third side 324c extends along the y direction and is located on one side of the second side 324b in the x direction. The fourth side 324d extends along the x direction and is located on the other side of the first side 324a in they direction. The fifth side 324e has an arc shape along the groove part 27 of the base 2. The sixth side 324f is interposed between the first side 324a and the second side 324b, and connects them. In the illustrated example, the sixth side 324f has a convex curve shape. The seventh side 324g is interposed between the first side 324a and the third side 324c, and connects them. In the illustrated example, the seventh side 324g has a convex curve shape. The eighth side 324h is interposed between the second side 324b and the fourth side 324d, and connects them. In the illustrated example, the eighth side 324h has a convex curve shape. The ninth side 324i is connected to the third side 324c and reaches one side end (first surface 23) of the rear surface 22 in the x direction. In the illustrated example, the ninth side 324i has a concave curve shape. The tenth side 324j is connected to the fourth side 324d and reaches one side end (fourth surface 26) of the rear surface 22 in the y direction. In the illustrated example, the tenth side 324j has a concave curve shape.

Each of the plurality of connection parts 33 connects part of the main surface part 31 and part of the rear surface part 32. As illustrated in FIG. 3, the plurality of connection parts 33 are formed along the plurality of groove parts 27. In the illustrated example, the plurality of connection parts 33 include a first connection part 331, a second connection part 332, a third connection part 333, and a fourth connection part 334.

As illustrated in FIGS. 1 and 2, the first connection part 331 connects the edge part 3124 of the main surface second part 312 of the main surface part 31 and the rear surface first part 321 of the rear surface part 32. The second connection part 332 connects the edge part 3134 of the main surface third part 313 of the main surface part 31 and the rear surface second part 322 of the rear surface part 32. The third connection part 333 connects the edge part 3144 of the main surface fourth part 314 of the main surface part 31 and the rear surface third part 323 of the rear surface part 32. The fourth connection part 334 connects the edge part 3154 of the main surface fifth part 315 of the main surface part 31 and the rear surface fourth part 324 of the rear surface part 32.

<Insulating Layer 5>

The insulating layer 5 is formed at a suitable position on the main surface 21 and the rear surface 22 of the base 2. The material of the insulating layer 5 is not particularly limited and is an insulating resin or the like, and it is formed of, for example, a resist film. In the present embodiment, the insulating layer 5 includes a first part 51, a second part 52, a third part 53, a fourth part 54, and a rear surface part 58.

The first part 51, the second part 52, the third part 53, and the fourth part 54 are installed on the main surface 21 side in the z direction. As illustrated in FIG. 1, the first part 51 covers the groove part 27 from the z direction. Also, the first part 51 covers the edge part 3124 of the main surface second part 312. The shape of the first part 51 is not particularly limited, and is a quarter circle shape in the illustrated example. The second part 52 covers the groove part 27 from the z direction. Also, the second part 52 covers the edge part 3134 of the main surface third part 313. The shape of the second part 52 is not particularly limited, and is a quarter circle shape in the illustrated example. The third part 53 covers the groove part 27 from the z direction. Also, the third part 53 covers the edge part 3144 of the main surface fourth part 314. The shape of the third part 53 is not particularly limited, and is a quarter circle shape in the illustrated example. The fourth part 54 covers the groove part 27 from the z direction. Also, the fourth part 54 covers the edge part 3154 of the main surface fifth part 315. The shape of the fourth part 54 is not particularly limited, and is a quarter circle shape in the illustrated example.

The rear surface part 58 is installed on the rear surface 22 side in the z direction. As illustrated in FIG. 2, in the illustrated example, the rear surface part 58 has a first part 581, a second part 582, a third part 583, and a fourth part 584.

The first part 581 is a band-shaped part extending along the x direction. The first part 581 is located between the rear surface first part 321 and the rear surface second part 322 in the y direction. The second part 582 is a band-shaped part extending along the x direction. The second part 582 is located between the rear surface third part 323 and the rear surface fourth part 324 in they direction. The third part 583 is a band-shaped part extending along they direction. The third part 583 is located between the rear surface second part 322 and the rear surface third part 323 in the x direction. The fourth part 584 is a band-shaped part extending along the y direction. The fourth part 584 is located between the rear surface first part 321 and the rear surface fourth part 324 in the x direction.

<First Semiconductor Light-Emitting Element 41>

The first semiconductor light-emitting element 41 is a light source element of the semiconductor light-emitting device A1, and its specific configuration is not limited at all. For example, an LED chip, a semiconductor laser element, a VCSEL element, or the like may be used as the first semiconductor light-emitting element 41. In the following description, a case where the first semiconductor light-emitting element 41 is an LED chip will be described as an example.

In the present embodiment, the first semiconductor light-emitting element 41 emits green light. As illustrated in FIG. 1, the first semiconductor light-emitting element 41 is mounted on the pad part 3111 of the main surface first part 311 of the main surface part 31. The first semiconductor light-emitting element 41 includes an electrode 411 and an electrode 412. The electrode 411 and the electrode 412 are arranged on a side where the main surface 21 faces in the z direction. In the illustrated example, the electrode 411 is an anode electrode and the electrode 412 is a cathode electrode.

The first semiconductor light-emitting element 41 is bonded to the pad part 3111 of the main surface first part 311 by a first bonding material 419. The first bonding material 419 is an insulating bonding material, for example, an epoxy resin or a silicone resin.

<Second Semiconductor Light-Emitting Element 42>

The second semiconductor light-emitting element 42 is a light source element of the semiconductor light-emitting device A1, and its specific configuration is not limited at all. For example, an LED chip, a semiconductor laser element, a VCSEL element, or the like may be used as the second semiconductor light-emitting element 42. In the following description, a case where the second semiconductor light-emitting element 42 is an LED chip will be described as an example.

In the present embodiment, the second semiconductor light-emitting element 42 emits blue light. As illustrated in FIG. 1, the second semiconductor light-emitting element 42 is mounted on the pad part 3111 of the main surface first part 311 of the main surface part 31. The second semiconductor light-emitting element 42 is arranged on one side of the first semiconductor light-emitting element 41 in the x direction. The second semiconductor light-emitting element 42 includes an electrode 421 and an electrode 422. The electrode 421 and the electrode 422 are arranged on a side where the main surface 21 faces in the z direction. In the illustrated example, the electrode 421 is an anode electrode and the electrode 422 is a cathode electrode.

The second semiconductor light-emitting element 42 is bonded to the pad part 3111 of the main surface first part 311 by a second bonding material 429. The second bonding material 429 is an insulating bonding material, for example, an epoxy resin or a silicone resin similar to the first bonding material 419.

<Third Semiconductor Light-Emitting Element 43>

The third semiconductor light-emitting element 43 is a light source element of the semiconductor light-emitting device A1, and its specific configuration is not limited at all. For example, an LED chip, a semiconductor laser element, a VCSEL element, or the like may be used as the third semiconductor light-emitting element 43. In the following description, a case where the third semiconductor light-emitting element 43 is an LED chip will be described as an example.

In the present embodiment, the third semiconductor light-emitting element 43 emits red light. As illustrated in FIG. 1, the third semiconductor light-emitting element 43 is mounted on the pad part 3121 of the main surface second part 312 of the main surface part 31. As illustrated in FIGS. 1 and 6, the third semiconductor light-emitting element 43 has an electrode 431 and an electrode 432. The electrode 431 is arranged on a side where the main surface 21 faces in the z direction. The electrode 432 is arranged on a side where the rear surface 22 faces in the z direction. In the illustrated example, the electrode 431 is a cathode electrode and the electrode 432 is an anode electrode.

The third semiconductor light-emitting element 43 is bonded to the pad part 3121 of the main surface second part 312 by a third bonding material 439. The third bonding material 439 is a conductive bonding material, for example, solder or Ag paste.

<First Wire 418>

The two first wires 418 are connected to the first semiconductor light-emitting element 41. One first wire 418 is connected to the electrode 411 of the first semiconductor light-emitting element 41 and the pad part 3121 of the main surface second part 312. The bonding part 4181 of the first wire 418 connected to the pad part 3121 is arranged on the other side of the third semiconductor light-emitting element 43 in the x direction. The other first wire 418 is connected to the electrode 412 of the first semiconductor light-emitting element 41 and the pad part 3131 of the main surface third part 313. The material of the first wires 418 is not particularly limited, and is, for example, Au.

<Second Wire 428>

The two second wires 428 are connected to the second semiconductor light-emitting element 42. One second wire 428 is connected to the electrode 421 of the second semiconductor light-emitting element 42 and the pad part 3121 of the main surface second part 312. The bonding part 4281 of the second wire 428 connected to the pad part 3121 is located between the third semiconductor light-emitting element 43 and the bonding part 4181 of the first wire 418 in the x direction. The other second wire 428 is connected to the electrode 422 of the second semiconductor light-emitting element 42 and the pad part 3141 of the main surface fourth part 314. The material of the second wires 428 is not particularly limited, and is, for example, Au.

<Third Wire 438>

The single third wire 438 is connected to the third semiconductor light-emitting element 43. The third wire 438 is connected to the electrode 431 of the third semiconductor light-emitting element 43 and the pad part 3151 of the main surface fifth part 315. The material of the third wire 438 is not particularly limited, and is, for example, Au.

<Light-Transmitting Resin Part 6>

The light-transmitting resin part 6 is formed on the main surface 21 side of the base 2 as illustrated in FIGS. 3 to 7, and covers the first semiconductor light-emitting element 41, the second semiconductor light-emitting element 42, the third semiconductor light-emitting element 43, the two first wires 481, the two second wires 482, and the third wire 438. The light-transmitting resin part 6 is made of a material that transmits light from the first semiconductor light-emitting element 41, the second semiconductor light-emitting element 42, and the third semiconductor light-emitting element 43, and uses, for example, an epoxy resin or a silicone resin as a main component. In the present embodiment, the light-transmitting resin part 6 is transparent, but may be translucent.

Next, an example of a method of manufacturing the semiconductor light-emitting device A1 will be described with reference to FIGS. 10 to 13.

Figure 10:
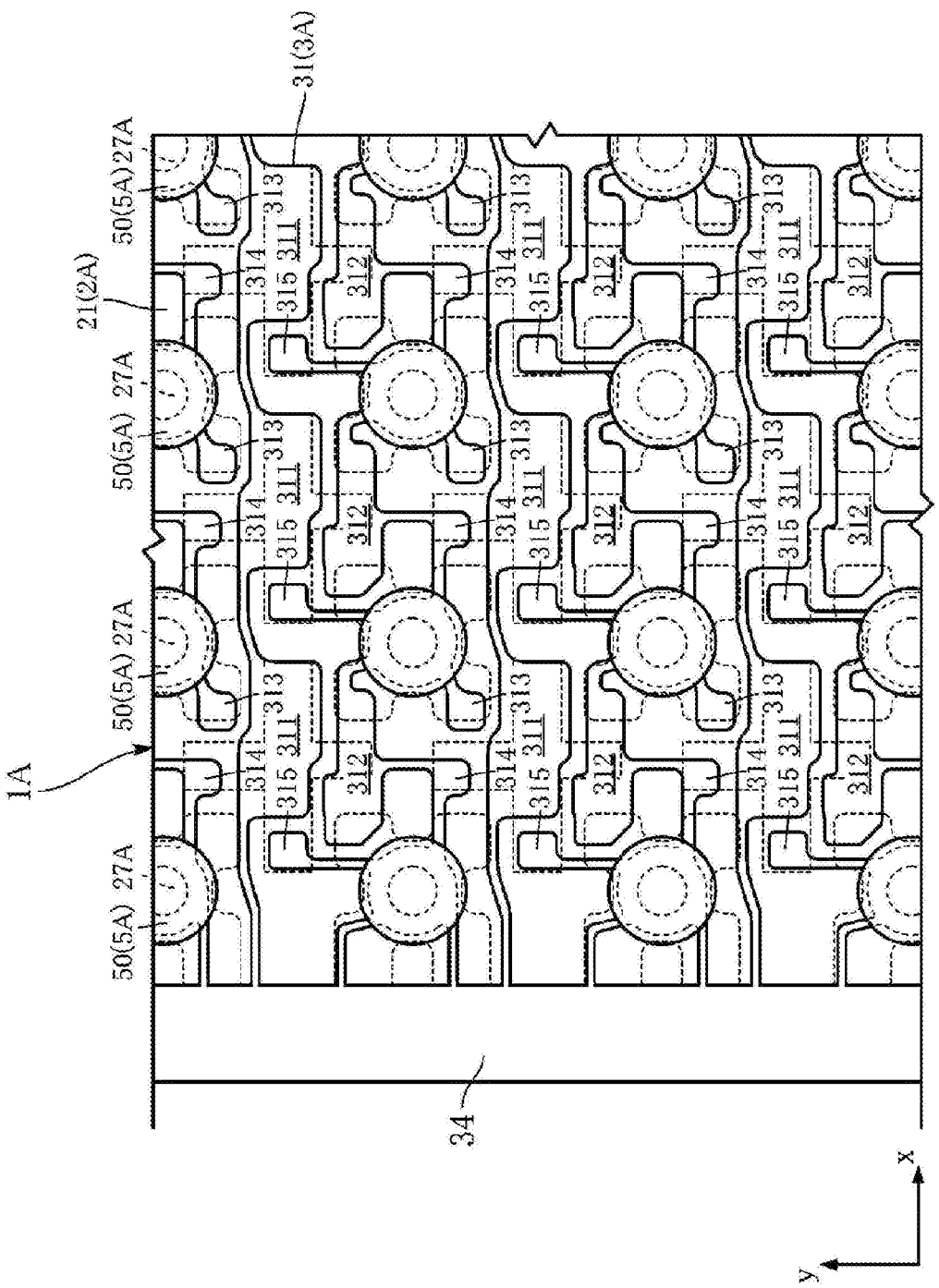
FIG. 10 is a plan view of a principal part illustrating an example of a method of manufacturing the semiconductor light-emitting device according to the first embodiment of the present disclosure.

First, as illustrated in FIG. 10, a substrate 1A is prepared. The substrate 1A is made of a substrate material capable of forming a plurality of substrates 1 of the semiconductor light-emitting device A1 described above. The substrate 1A includes a base 2A, a conductive part 3A, and insulating layers 5A. The base 2A is a plate material capable of forming a plurality of bases 2. The conductive part 3A is a conductive part that becomes the conductive part 3 described above. The insulating layers 5A are insulating parts that become the insulating layers 5 described above.

In the present embodiment, a plurality of through holes 27A are formed in the base 2. The through holes 27A are parts that become the groove parts 27 by being divided at a subsequent step.

In the conductive part 3A, a plurality of main surface first parts 311 are arranged side by side in the x direction and are connected to each other. In addition, the main surface second part 312, the main surface third part 313, the main surface fourth part 314, and the main surface fifth part 315 are connected to each other. The main surface first part 311, the main surface second part 312, the main surface third part 313, the main surface fourth part 314, and the main surface fifth part 315 are connected to a frame part 34. The frame part 34 is a part that functions as, for example, a plating electrode for forming the conductive part 3A.

The insulating layers 5A have a plurality of circular parts 50. The circular parts 50 are parts that become the first part 51, the second part 52, the third part 53, and the fourth part 54 by being divided at a subsequent step.

Figure 11:
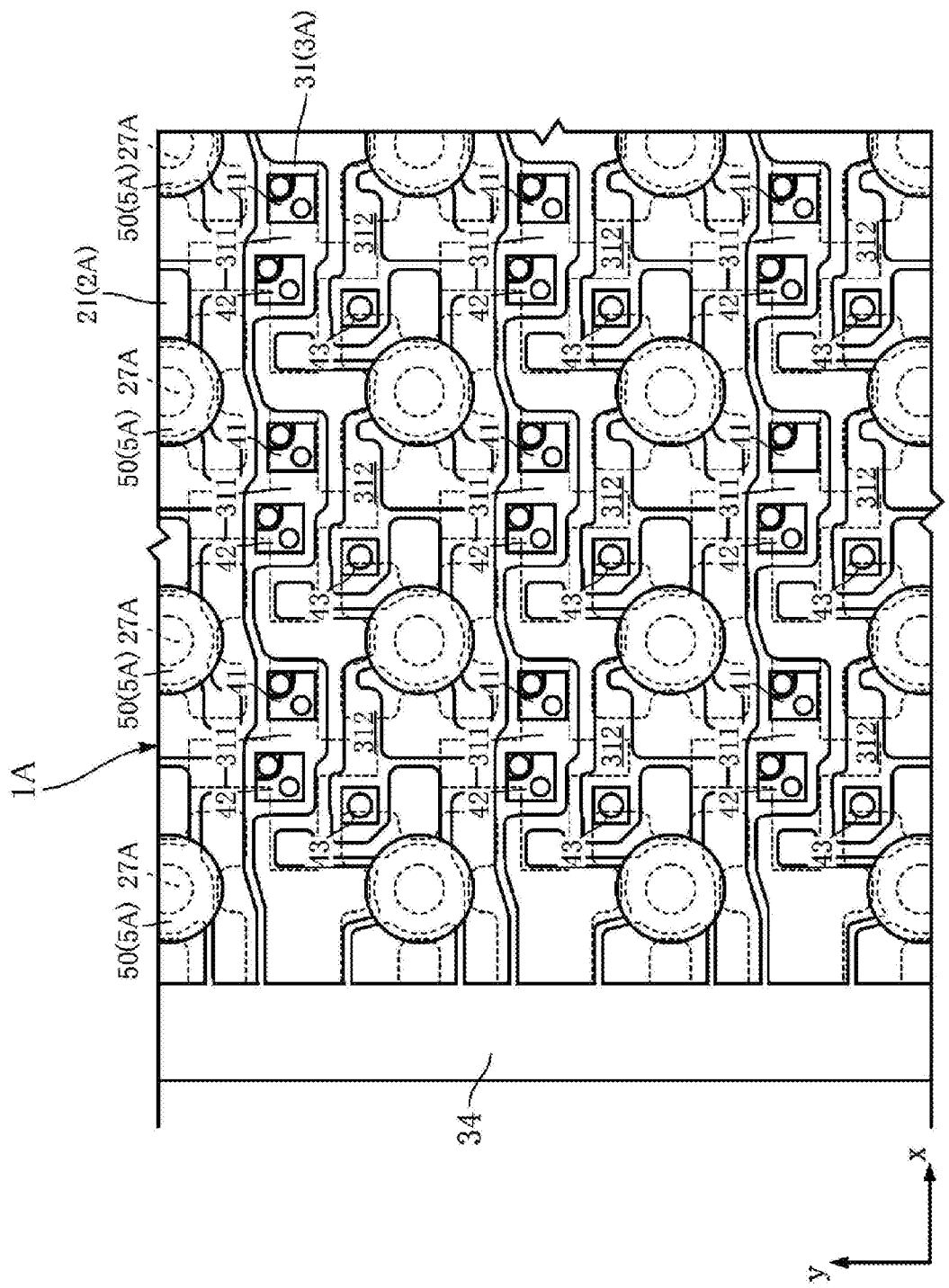
FIG. 11 is a plan view of a principal part illustrating an example of the method of manufacturing the semiconductor light-emitting device according to the first embodiment of the present disclosure.

Next, as illustrated in FIG. 11, the first semiconductor light-emitting element 41, the second semiconductor light-emitting element 42, and the third semiconductor light-emitting element 43 are mounted. When mounting the first semiconductor light-emitting element 41 and the second semiconductor light-emitting element 42, the first semiconductor light-emitting element 41 and the second semiconductor light-emitting element 42 are adhered to the pad part 3111 of the main surface first part 311 by, for example, an insulating liquid resin material, to form the first bonding material 419 and the second bonding material 429 described above by curing the resin material. In addition, when mounting the third semiconductor light-emitting element 43, the third semiconductor light-emitting element 43 is bonded to the pad part 3121 of the main surface second part 312 by, for example, solder or Ag paste.

Figure 12:
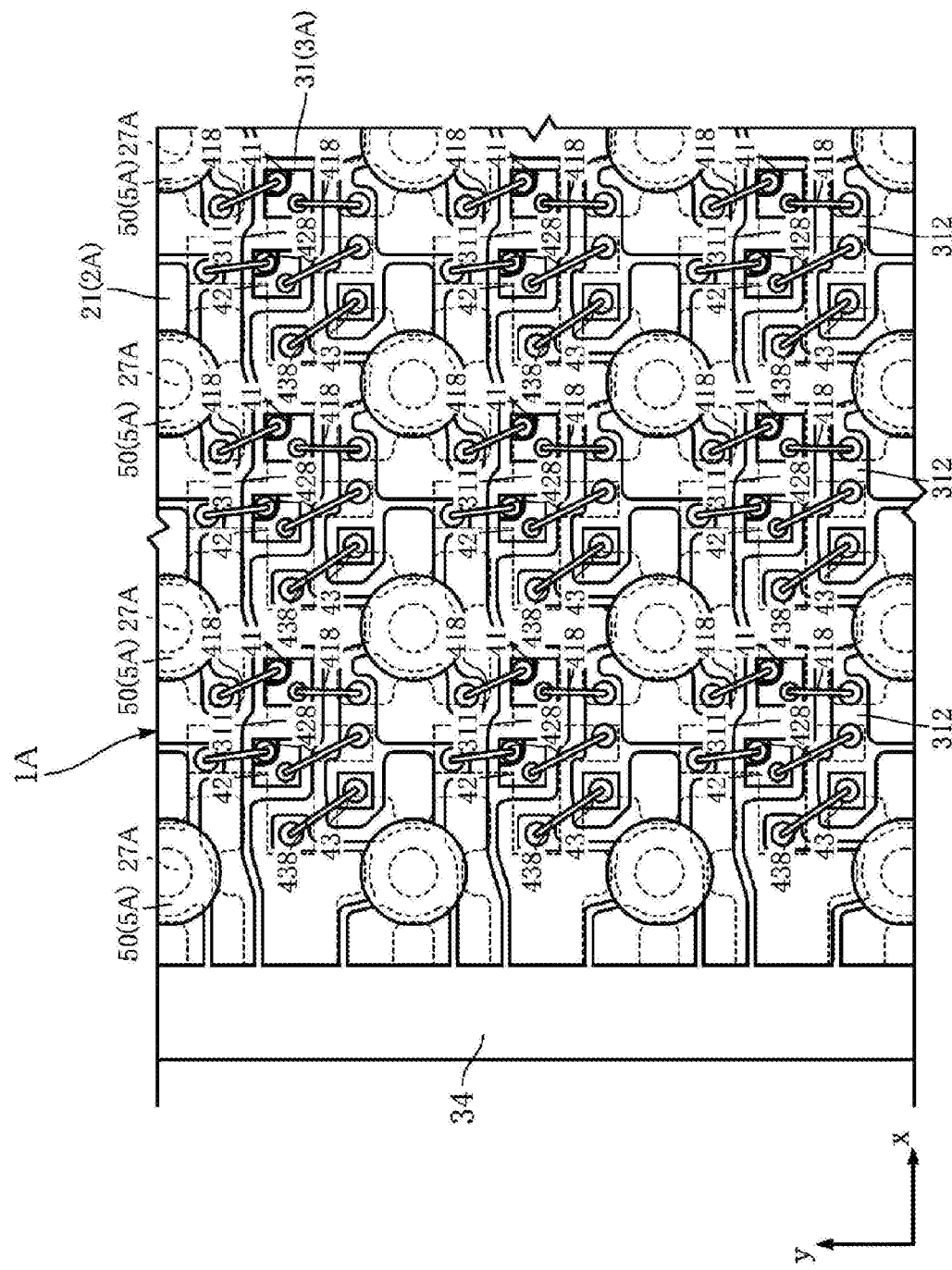
FIG. 12 is a plan view of a principal part illustrating an example of the method of manufacturing the semiconductor light-emitting device according to the first embodiment of the present disclosure.
Figure 13:
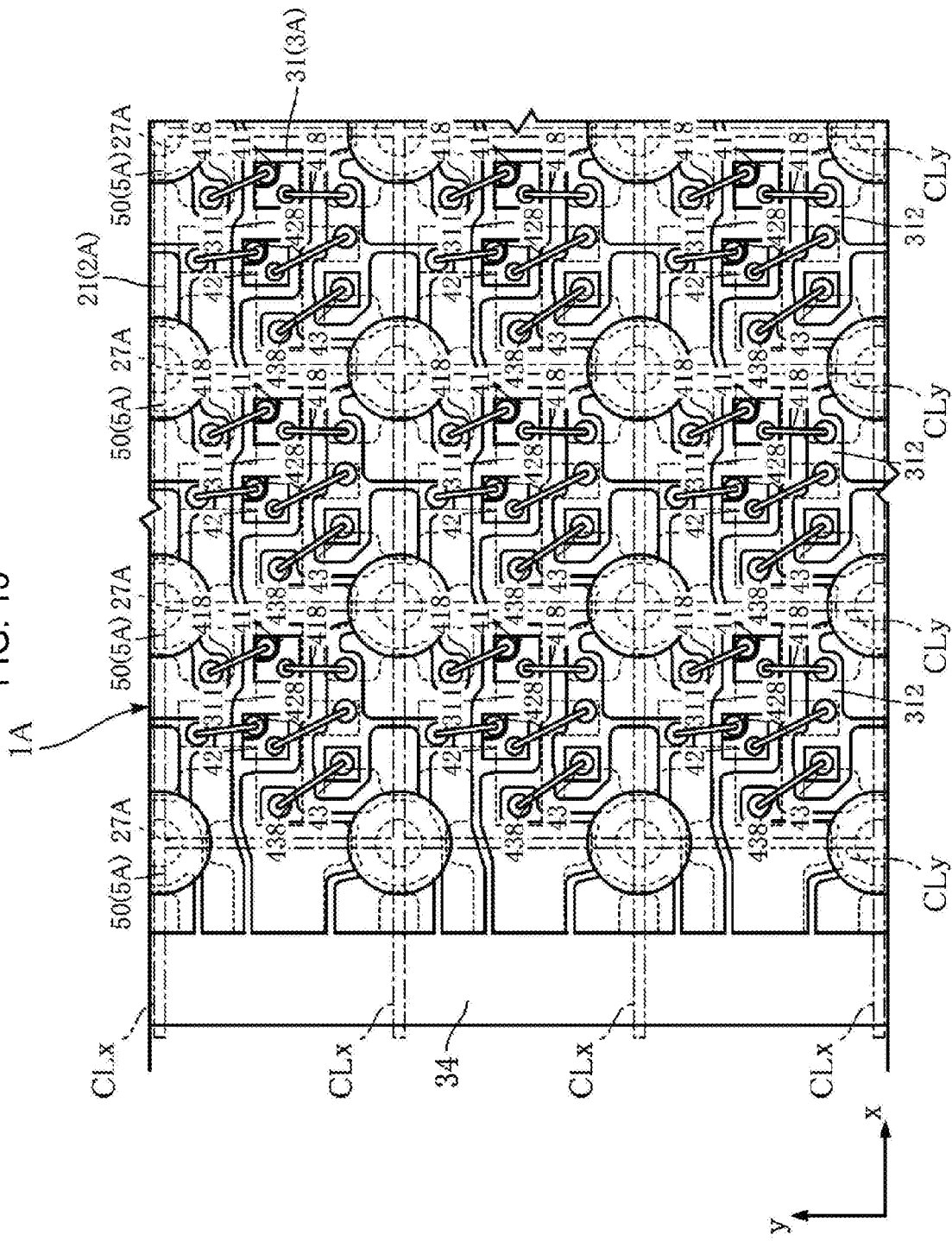
FIG. 13 is a plan view of a principal part illustrating an example of the method of manufacturing the semiconductor light-emitting device according to the first embodiment of the present disclosure.

Next, as illustrated in FIG. 12, the first wires 418, the second wires 428, and the third wire 438 are each bonded. Then, a resin member (not shown) made of a light-transmitting resin is formed on the main surface 21 side of the base 2A so as to cover the first semiconductor light-emitting element 41, the second semiconductor light-emitting element 42, the third semiconductor light-emitting element 43, the first wires 418, the second wires 428, and the third wire 438. Thereafter, as illustrated in FIG. 13, the substrate 1A and the resin member are cut along a cutting line CLx and a cutting line CLy. In FIG. 13, the resin member is omitted for convenience of understanding. A plurality of semiconductor light-emitting devices A1 can be obtained through the aforementioned steps.

Next, an operation of the semiconductor light-emitting device A1 will be described.

According to the present embodiment, as illustrated in FIG. 1, the main surface first part 311 including the pad part 3111 on which the first semiconductor light-emitting element 41 and the second semiconductor light-emitting element 42 are mounted is separated from any of the main surface second part 312, the main surface third part 313, the main surface fourth part 314, and the main surface fifth part 315, which are other parts of the main surface part 31. Therefore, the first bonding material 419 and the second bonding material 429 for bonding the first semiconductor light-emitting element 41 and the second semiconductor light-emitting element 42 can be suppressed from reaching the main surface second part 312, the main surface third part 313, the main surface fourth part 314, and the main surface fifth part 315, and the bonding of the third semiconductor light-emitting element 43 or the bonding of the first wires 418, the second wires 428, and the third wire 438 can be performed in a more suitable state. Accordingly, unnecessary separation of the first semiconductor light-emitting element 41 and the second semiconductor light-emitting element 42 from the third semiconductor light-emitting element 43 and the like is not forced. Thus, it is possible to promote miniaturization of the semiconductor light-emitting device A1.

Moreover, the main surface first part 311 reaches both ends of the main surface 21 in the x direction by having the first extension part 3112 and the second extension part 3113. In the manufacturing process of the semiconductor light-emitting device A1 having such a configuration, as illustrated in FIG. 10, the substrate 1A including the conductive part 3A including the plurality of main surface first parts 311 connected to each other may be used. According to the substrate 1A, the plurality of main surface first parts 311 are electrically connected to, for example, the frame part 34, thereby suitably performing plating treatment.

In the present embodiment, the first semiconductor light-emitting element 41 and the second semiconductor light-emitting element 42 are bonded to the pad part 3111 by the insulating first bonding material 419 and second bonding material 429. The insulating first bonding material 419 and second bonding material 429 made of resin or the like are likely to spread when formed as compared to the solder or the like. According to the present embodiment, even if the first bonding material 419 and the second bonding material 429 spread, it is possible to suppress them from reaching the main surface second part 312, the main surface third part 313, the main surface fourth part 314, and the main surface fifth part 315.

FIGS. 14 to 20 illustrate other embodiments of the present disclosure. Further, in these drawings, the same or similar elements as those in the aforementioned embodiment are denoted by the same reference numerals as those in the aforementioned embodiment.

Second Embodiment

Figure 14:
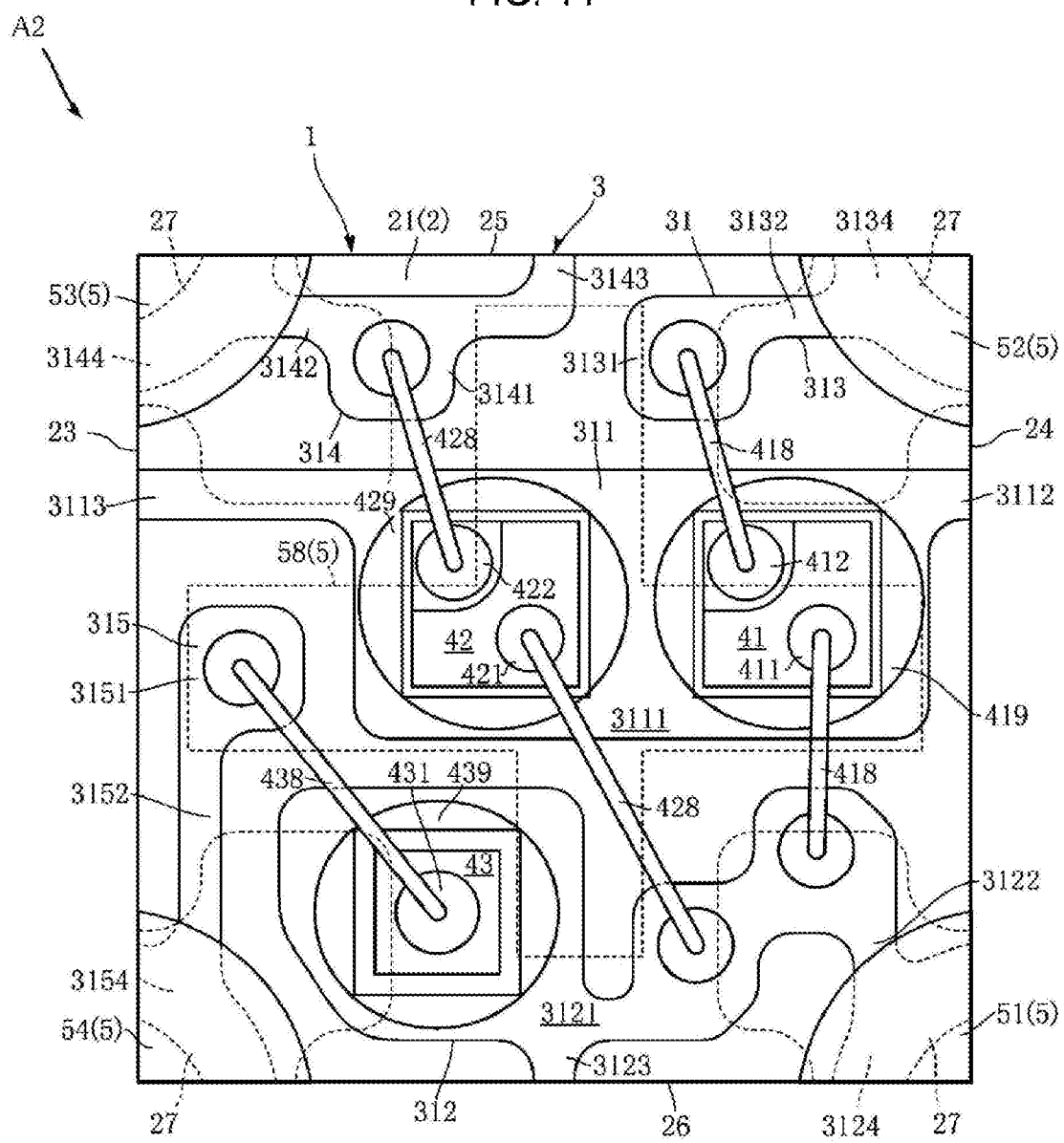
FIG. 14 is a plan view of a principal part illustrating a semiconductor light-emitting device according to a second embodiment of the present disclosure.
Figure 15:
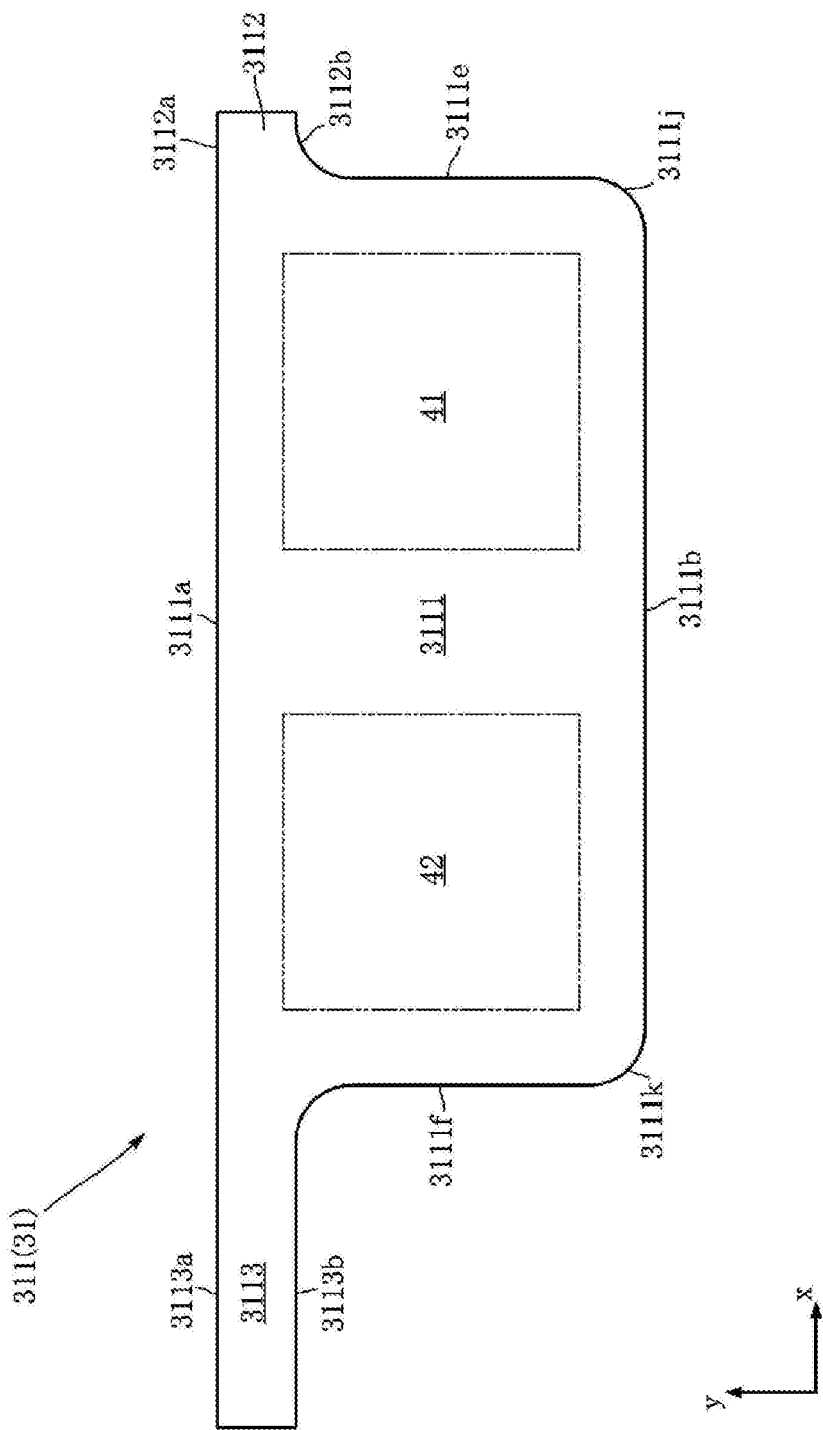
FIG. 15 is a plan view illustrating a main surface first part of the semiconductor light-emitting device according to the second embodiment of the present disclosure.
Figure 16:
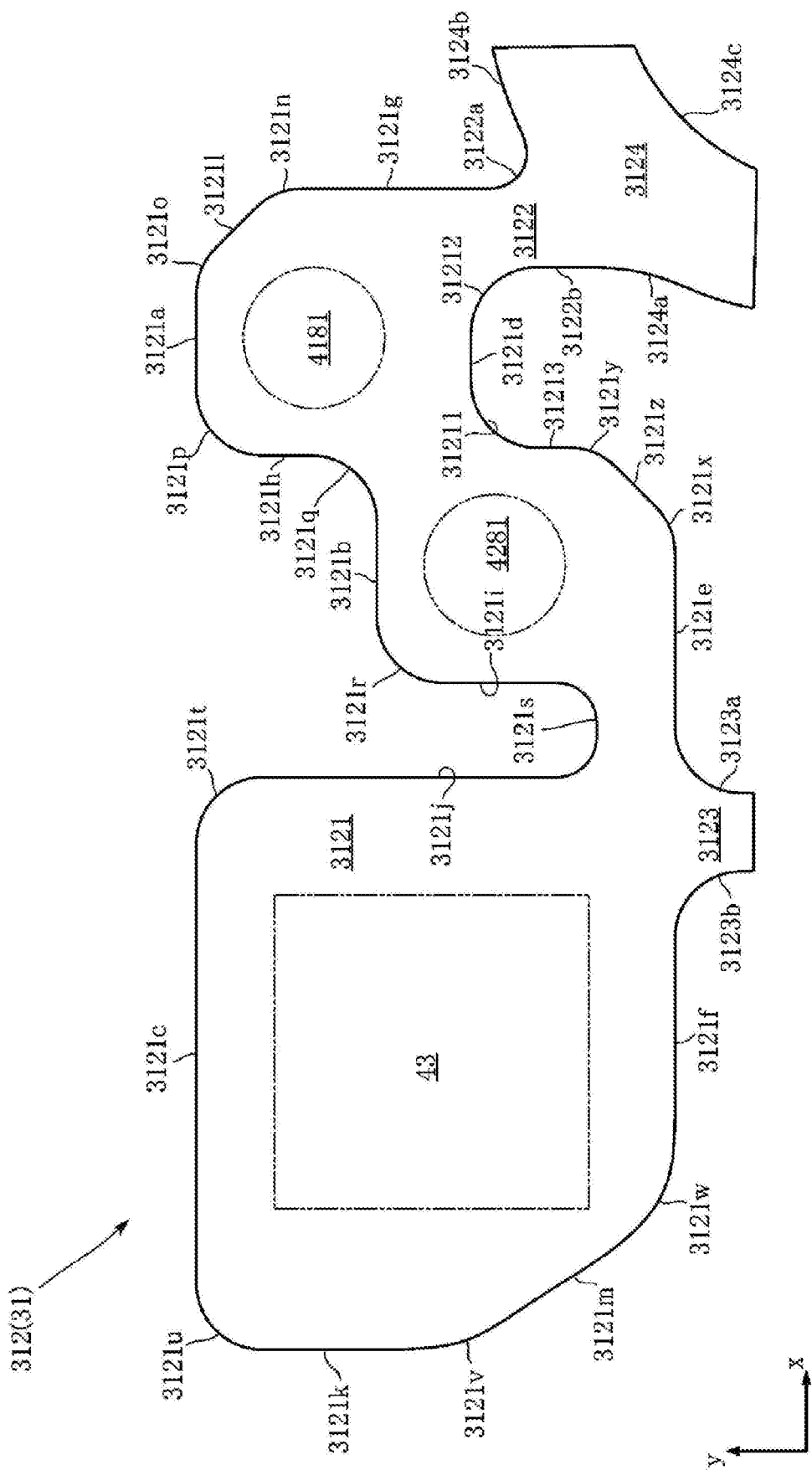
FIG. 16 is a plan view illustrating a main surface second part of the semiconductor light-emitting device according to the second embodiment of the present disclosure.

FIGS. 14 to 16 illustrate a semiconductor light-emitting device according to a second embodiment of the present disclosure. A semiconductor light-emitting device A2 of the present embodiment is different from the semiconductor light-emitting device A1 described above, mainly in the configuration of the main surface part 31.

As illustrated in FIG. 15, the pad part 3111 of the main surface first part 311 of the present embodiment has a first side 3111a, a second side 3111b, a fifth side 3111e, a tenth side 3111j, and a sixth side 3111f.

The first side 3111a extends along the x direction. The second side 3111b extends along the x direction, and is located on one side of the first side 3111a in the y direction.

The fifth side 3111e extends along they direction, and is located between the first side 3111a and the second side 3111b in they direction. The sixth side 3111f extends along the y direction. The sixth side 3111f is located on one side of the fifth side 3111e in the x direction, and is located between the first side 3111a and the second side 3111b in they direction.

The tenth side 3111j is interposed between the second side 3111b and the fifth side 3111e, and connects them. In the illustrated example, the tenth side 3111j has a convex curve shape. The eleventh side 3111k is interposed between the second side 3111b and the sixth side 3111f, and connects them. In the illustrated example, the eleventh side 3111k has a convex curve shape.

The first extension part 3112 of the present embodiment has a first side 3112a and a second side 3112b. The first side 3112a extends along the x direction and is connected to the first side 3111a of the pad part 3111. The second side 3112b is located on one side of the first side 3112a in they direction. The second side 3112b is connected to the fifth side 3111e of the pad part 3111, and has a concave curve shape in the illustrated example.

The second extension part 3113 of the present embodiment includes a first side 3113a and a second side 3113b. The first side 3113a extends along the x direction and is connected to the first side 3111a of the pad part 3111. The second side 3113b is located on one side of the first side 3113a in they direction, and is connected to the sixth side 3111f of the pad part 3111.

As illustrated in FIG. 16, the pad part 3121 of the main surface second part 312 of the present embodiment includes a first side 3121a, a second side 3121b, a third side 3121c, a fourth side 3121d, a fifth side 3121e, a sixth side 2121f, a seventh side 3121g, an eighth side 3121h, a ninth side 3121i, a tenth side 3121j, an eleventh side 3121k, a twelfth side 3121l, a thirteenth side 3121m, a fourteenth side 3121n, a fifteenth side 3121o, a sixteenth side 3121p, a seventeenth side 3121q, an eighteenth side 3121r, a nineteenth side 3121s, a twentieth side 3121t, a twenty-first side 3121u, a twenty-second side 3121v, a twenty-third side 3121w, a twenty-fourth side 3121x, a twenty-fifth side 3121y, a twenty-sixth side 3121z, a twenty-seventh side 31211, a twenty-eighth side 31212, and a twenty-ninth side 31213.

The first side 3121a has a shape along the x direction. The second side 3121b has a shape along the x direction. The second side 3121b is located on one side of the first side 3121a in the x direction and on one side thereof in they direction. The third side 3121c has a shape along the x direction. The third side 3121c is located on one side of the second side 3121b in the x direction and on the other side thereof in they direction. The position of the third side 3121c in they direction is substantially the same as the position of the first side 3121a in the y direction.

The fourth side 3121d has a shape along the x direction. The fourth side 3121d is located on one side of the first side 3121a in they direction. The fifth side 3121e has a shape along the x direction. The fifth side 3121e is located on one side of the second side 3121b in they direction. Also, the fifth side 3121e is located on one side of the fourth side 3121d in the x direction and on one side thereof in they direction. The sixth side 3121f has a shape along the x direction. The sixth side 3121f is located on one side of the third side 3121c in the y direction. Also, the sixth side 3121f is located on one side of the fifth side 3121e in the x direction, and thus has substantially the same position in the y direction.

The seventh side 3121g has a shape along they direction. The seventh side 3121g is located on the other side of the first side 3121a and the fourth side 3121d in the x direction. The eighth side 3121h has a shape along they direction. The eighth side 3121h is located between the first side 3121a and the second side 3121b in the x direction and they direction. The ninth side 3121i has a shape along they direction. The ninth side 3121i is located on one side of the second side 3121b in the x direction and on one side thereof in they direction. The tenth side 3121j has a shape along they direction. The tenth side 3121j is located on one side of the ninth side 3121i in the x direction, and faces the ninth side 3121i. The eleventh side 3121k has a shape along they direction. The eleventh side 3121k is located on one side of the third side 3121c and the sixth side 3121f in the x direction, and is located between the third side 3121c and the sixth side 3121f in they direction. The twenty-ninth side 31213 has a shape along they direction. The twenty-ninth side 31213 is located between the fourth side 3121d and the fifth side 3121e in the x direction and they direction.

The twelfth side 3121l is inclined with respect to the x direction and they direction. The twelfth side 3121l is located between the first side 3121a and the seventh side 3121g in the x direction and they direction. The thirteenth side 3121m is inclined with respect to the x direction and they direction. The thirteenth side 3121m is located between the sixth side 3121f and the eleventh side 3121k in the x direction and they direction. The twenty-sixth side 3121z is inclined with respect to the x direction and they direction. The twenty-sixth side 3121z is located between the fifth side 3121e and the twenty-ninth side 31213 in the x direction and the y direction.

The fourteenth side 3121n is located between the seventh side 3121g and the twelfth side 3121l, and connects them. In the illustrated example, the fourteenth side 3121n has a convex curve shape. The fifteenth side 31210 is located between the first side 3121a and the twelfth side 3121l, and connects them. In the illustrated example, the fifteenth side 31210 has a convex curve shape. The sixteenth side 3121p is located between the first side 3121a and the eighth side 3121h, and connects them. In the illustrated example, the sixteenth side 3121p has a convex curve shape. The seventeenth side 3121*q* is located between the eighth side 3121*h* and the second side 3121*b*, and connects them. In the illustrated example, the seventeenth side 3121*q* has a concave curve shape. The eighteenth side 3121*r* is located between the second side 3121*b* and the ninth side 3121*i*, and connects them. In the illustrated example, the eighteenth side 3121*r* has a convex curve shape.

The nineteenth side 3121*s* is located between the ninth side 3121*i* and the tenth side 3121*j*, and connects them. In the illustrated example, the nineteenth side 3121*s* has a convex curve shape. The twentieth side 3121*t* is located between the third side 3121*c* and the tenth side 3121*j*, and connects them. In the illustrated example, the twentieth side 3121*t* has a convex curve shape. The twenty-first side 3121*u* is located between the third side 3121*c* and the eleventh side 3121*k*, and connects them. In the illustrated example, the twenty-first side 3121*u* has a convex curve shape. The twenty-second side 3121*v* is located between the eleventh side 3121*k* and the thirteenth side 3121*m*, and connects them. In the illustrated example, the twenty-second side 3121*v* has a convex curve shape. The twenty-third side 3121*w* is located between the sixth side 3121*f* and the thirteenth side 3121*m*, and connects them. In the illustrated example, the twenty-third side 3121*w* has a convex curve shape. The twenty-fourth side 3121*x* is located between the fifth side 3121*e* and the twenty-sixth side 3121*z*, and connects them. In the illustrated example, the twenty-fourth side 3121*x* has a convex curve shape. The twenty-fifth side 3121*y* is located between the twenty-fourth side 3121*x* and the twenty-ninth side 31213, and connects them. In the illustrated example, the twenty-fifth side 3121*y* has a convex curve shape. The twenty-seventh side 31211 is located between the fourth side 3121*d* and the twenty-ninth side 31213, and connects them. In the illustrated example, the twenty-seventh side 31211 has a concave curve shape. The twenty-eighth side 31212 is connected to the fourth side 3121*d*. In the illustrated example, the twenty-eighth side 31212 has a convex curve shape.

In the present embodiment, the pad part 3121 has a constricted shape sandwiched between the seventeenth side 3121*q* and the twenty-seventh side 31211. The bonding part 4181 and the first wire 4182 are arranged separately from each other with the constricted part interposed therebetween. Furthermore, a part sandwiched between the fifth side 3121*e* and the nineteenth side 3121*s* has a constricted shape. The third semiconductor light-emitting element 43 and the bonding part 4281 are arranged separately from each other with the constricted part interposed therebetween.

Even in the present embodiment, it is possible to promote miniaturization of the semiconductor light-emitting device A2.

Third Embodiment

Figure 18:
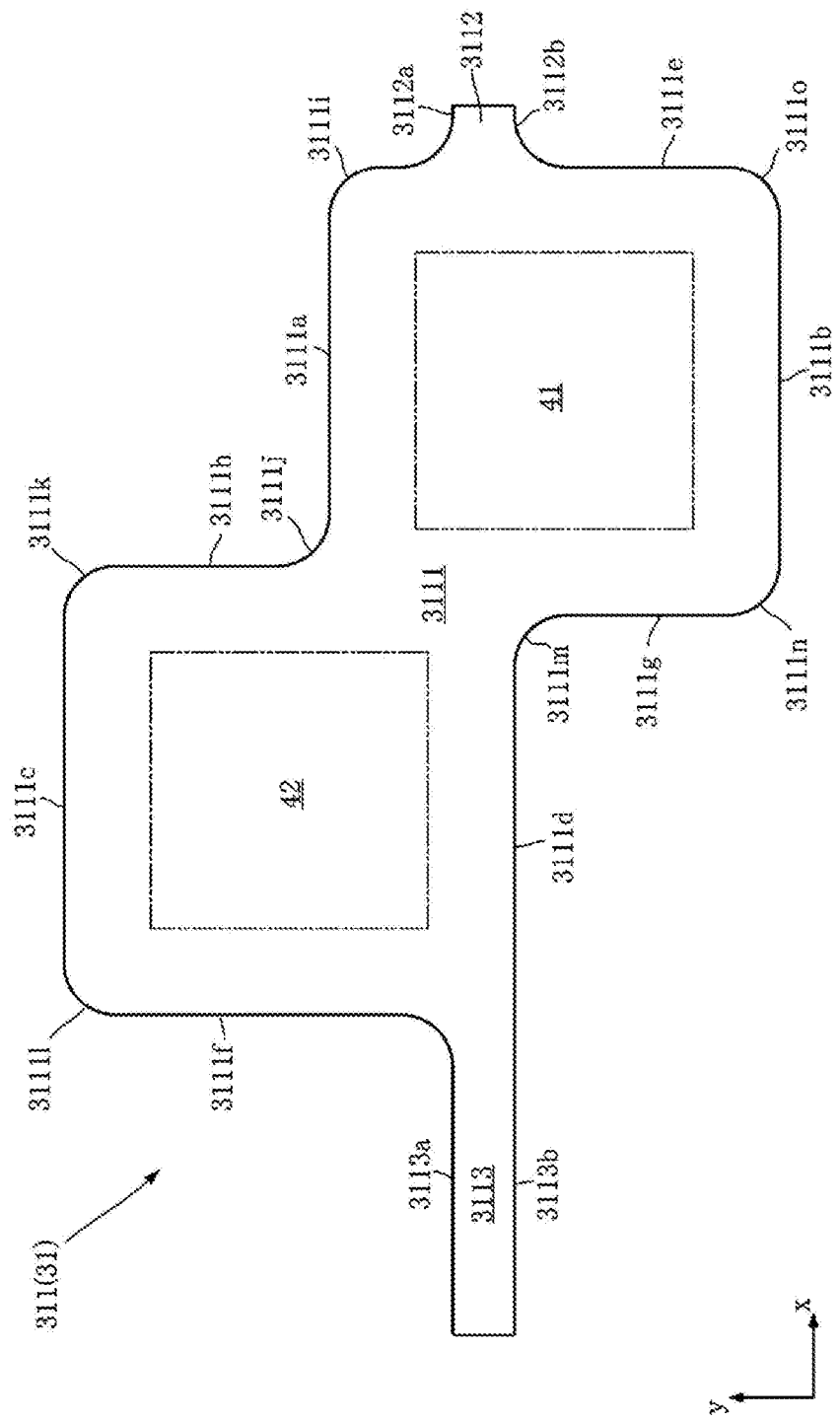
FIG. 18 is a plan view illustrating a main surface first part of the semiconductor light-emitting device according to the third embodiment of the present disclosure.
Figure 19:
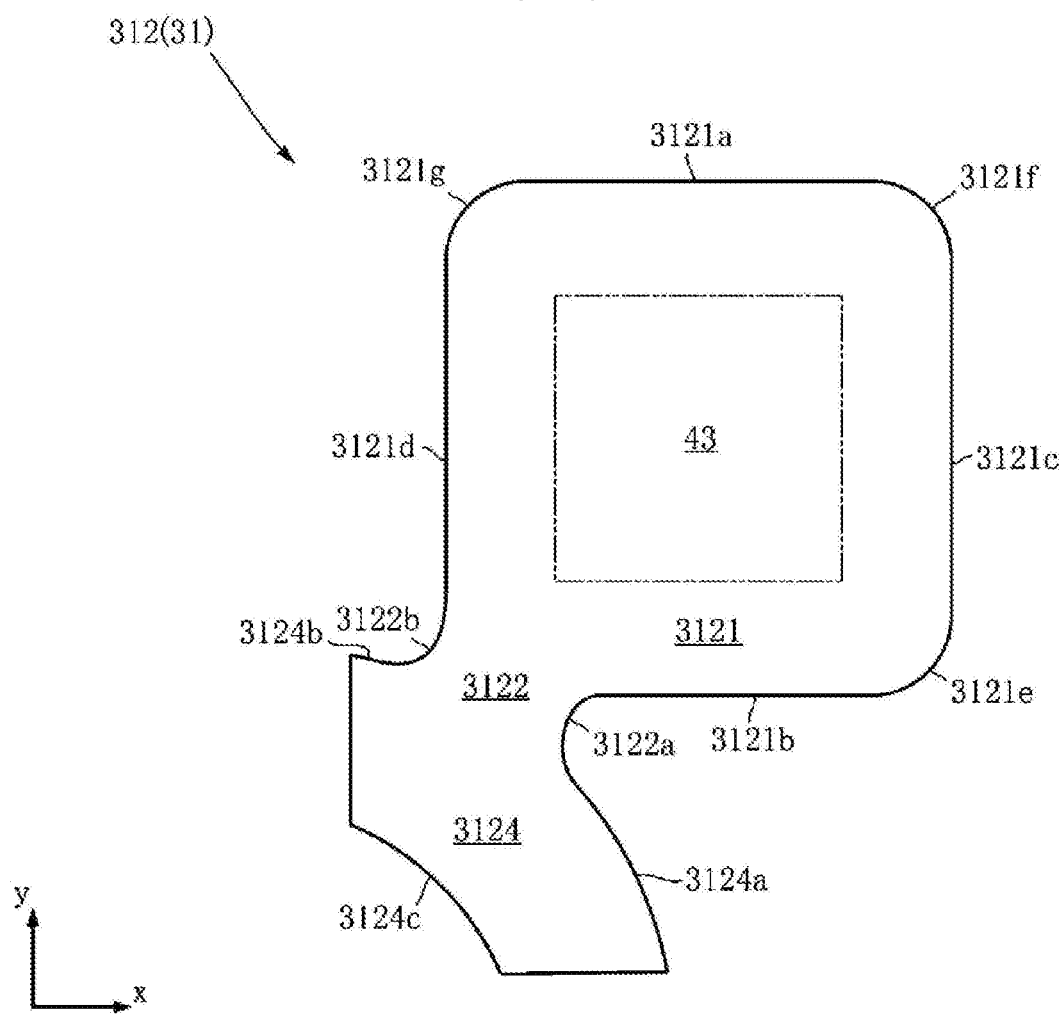
FIG. 19 is a plan view illustrating a main surface second part of the semiconductor light-emitting device according to the third embodiment of the present disclosure.
Figure 20:
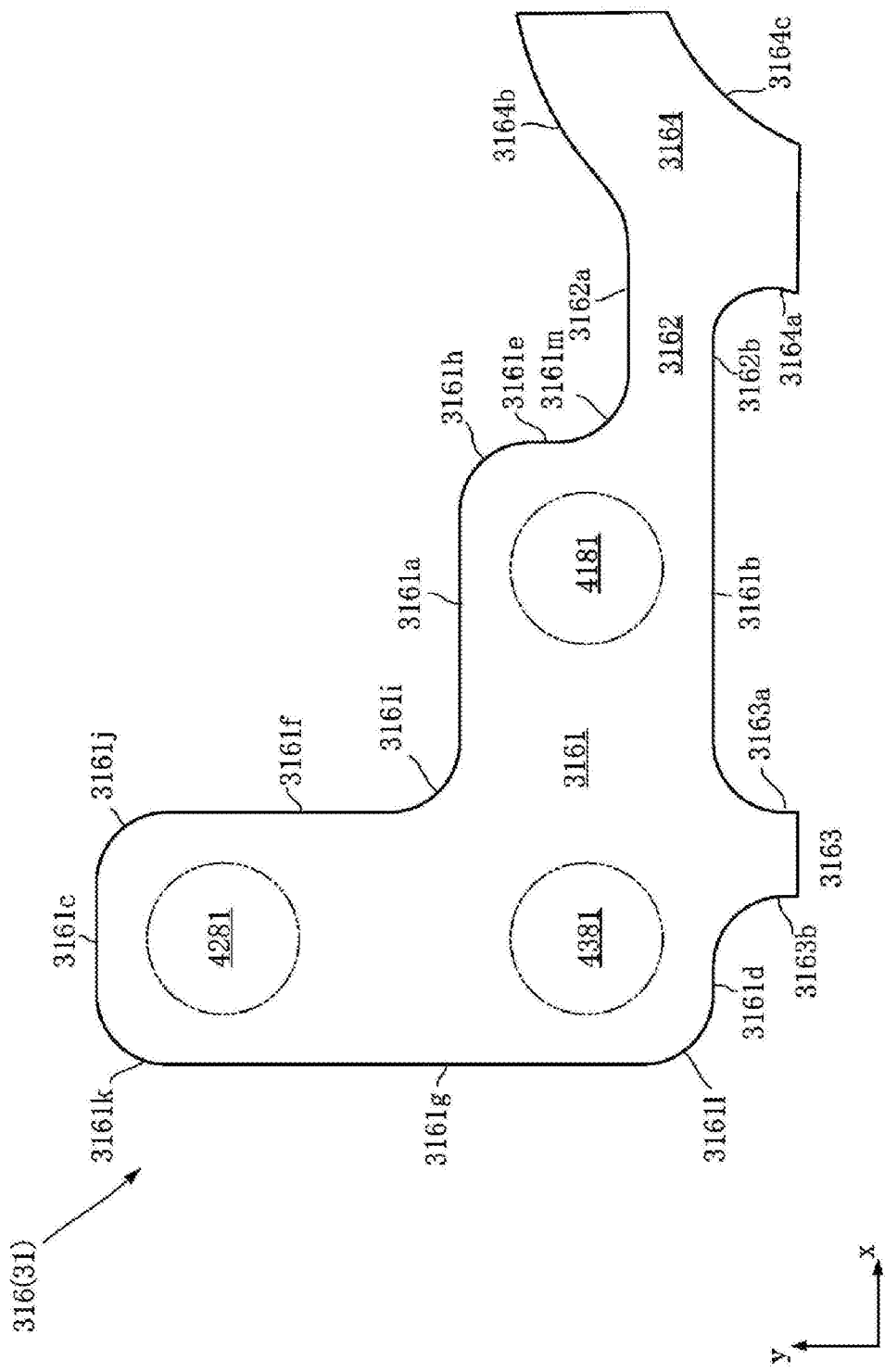
FIG. 20 is a plan view illustrating a main surface sixth part of the semiconductor light-emitting device according to the third embodiment of the present disclosure.

FIGS. 18 to 20 illustrate a semiconductor light-emitting device according to a third embodiment of the present disclosure. A semiconductor light-emitting device A3 of the present embodiment is different from the aforementioned embodiments, mainly in the configuration of the main surface part 31 and the arrangement of the first semiconductor light-emitting element 41, the second semiconductor light-emitting element 42, the third semiconductor light-emitting element 43, the first wires 418, the second wires 428, and the third wire 438.

Figure 17:
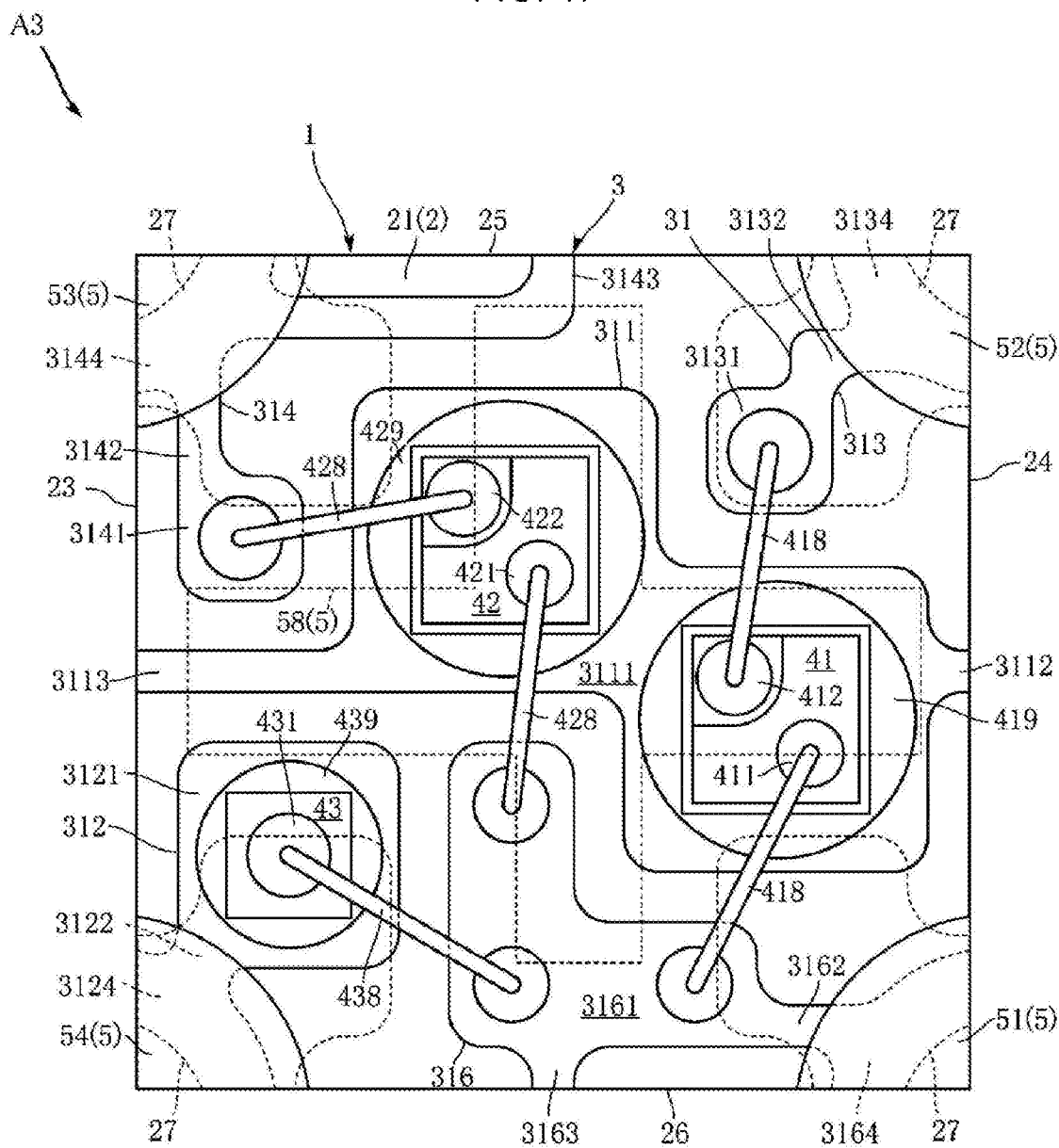
FIG. 17 is a plan view of a principal part illustrating a semiconductor light-emitting device according to a third embodiment of the present disclosure.

As illustrated in FIG. 17, the main surface part 31 of the present embodiment includes a main surface first part 311, a main surface second part 312, a main surface third part 313, a main surface fourth part 314, and a main surface sixth part 316.

As illustrated in FIG. 18, the pad part 3111 of the present embodiment has a first side 3111*a*, a second side 3111*b*, a third side 3111*c*, a fourth side 3111*d*, a fifth side 3111*e*, a sixth side 3111*f*, a seventh side 3111*g*, an eighth side 3111*h*, a ninth side 3111*i*, a tenth side 3111*j*, an eleventh side 3111*k*, a twelfth side 3111*l*, a thirteenth side 3111*m*, a fourteenth side 3111*n*, and a fifteenth side 3111*o*.

The first side 3111*a* has a shape extending along the x direction. The second side 3111*b* has a shape extending along the x direction. The second side 3111*b* is located on one side of the first side 3111*a* in the y direction. The third side 3111*c* has a shape extending along the x direction. The third side 3111*c* is located on one side of the first side 3111*a* in the x direction and on the other side thereof in the y direction. The fourth side 3111*d* has a shape extending along the x direction. The fourth side 3111*d* is located on one side of the third side 3111*c* in the y direction. Also, the fourth side 3111*d* is located on one side of the second side 3111*b* in the x direction and on the other side thereof in the y direction.

The fifth side 3111*e* has a shape along they direction. The sixth side 3111*f* has a shape along they direction. The sixth side 3111*f* is located on one side of the third side 3111*c* and the fourth side 3111*d* in the x direction. Also, the sixth side 3111*f* is located between the third side 3111*c* and the fourth side 3111*d* in they direction. The seventh side 3111*g* has a shape along they direction. The seventh side 3111*g* is located between the second side 3111*b* and the fourth side 3111*d* in the x direction and they direction. The eighth side 3111*h* has a shape along the y direction. The eighth side 3111*h* is located between the first side 3111*a* and the third side 3111*c* in the x direction and the y direction.

The ninth side 3111*i* is connected to the other side of the first side 3111*a* in the x direction. In the illustrated example, the ninth side 3111*i* has a convex curve shape. The tenth side 3111*j* is located between the first side 3111*a* and the eighth side 3111*h*. In the illustrated example, the first side 3111*a* has a concave curve shape. The eleventh side 3111*k* is located between the eighth side 3111*h* and the third side 3111*c*. In the illustrated example, the eleventh side 3111*k* is curved. The twelfth side 3111*l* is located between the third side 3111*c* and the sixth side 3111*f* In the illustrated example, the twelfth side 3111*l* has a convex curve shape. The thirteenth side 3111*m* is located between the fourth side 3111*d* and the seventh side 3111*g*. In the illustrated example, the thirteenth side 3111*m* has a concave curve shape. The fourteenth side 3111*n* is located between the second side 3111*b* and the seventh side 3111*g*. In the illustrated example, the fourteenth side 3111*n* has a convex curve shape. The fifteenth side 3111*o* is located between the second side 3111*b* and the fifth side 3111*e*. In the illustrated example, the fifteenth side 3111*o* has a convex curve shape.

The pad part 3111 of the present embodiment has a constricted shape sandwiched between the twelfth side 3111*l* and the thirteenth side 3111*m*. The first semiconductor light-emitting element 41 and the second semiconductor light-emitting element 42 are arranged separately from each other with the constricted part interposed therebetween.

As illustrated in FIG. 19, the main surface second part 312 of the present embodiment has a pad part 3121, a first extension part 3122, and an edge part 3124.

The pad part 3121 is a part on which the third semiconductor light-emitting element 43 is mounted. The pad part 3121 includes a first side 3121*a*, a second side 3121*b*, a third side 3121*c*, a fourth side 3121*d*, a fifth side 3121*e*, a sixth side 3121*f*, and a seventh side 3121*g*.

The first side 3121*a* has a shape extending along the x direction. The second side 3121*b* has a shape extending along the x direction, and is located on one side of the first side 3121*a* in they direction. The third side 3121*c* has a shape extending along they direction. The third side 3121*c* is located between the first side 3121*a* and the second side 3121*b* in they direction. The fourth side 3121*d* has a shape along they direction. The fourth side 3121*d* is located on one side of the third side 3121*c* in the x direction. Also, the fourth side 3121*d* is located between the first side 3121*a* and the second side 3121*b* in they direction.

The fifth side 3121*e* is interposed between the second side 3121*b* and the third side 3121*c*, and connects them. In the illustrated example, the fifth side 3121*e* has a convex curve shape. The sixth side 3121*f* is interposed between the third side 3121*c* and the first side 3121*a*, and connects them. In the illustrated example, the sixth side 3121*f* has a convex curve shape. The seventh side 3121*g* is interposed between the first side 3121*a* and the fourth side 3121*d*, and connects them. In the illustrated example, the seventh side 3121*g* has a convex curve shape.

The first extension part 3122 extends from the pad part 3121 toward the groove part 27. The first extension part 3122 includes a first side 3122*a* and a second side 3122*b*. The first side 3122*a* is connected to the second side 3121*b* of the pad part 3121, and has a concave curve shape in the illustrated example. The second side 3122*b* is connected to the fourth side 3121*d* of the pad part 3121, and has a concave curve shape in the illustrated example.

The edge part 3124 is connected to the first extension part 3122, and has a shape along the groove part 27 of the base 2 as viewed in the z direction. In the illustrated example, the edge part 3124 has a first side 3124*a*, a second side 3124*b*, and a third side 3124*c*.

The first side 3124*a* has a convex arc shape, and is located on one side of the second side 3121*b* of the pad part 3121 in they direction in the illustrated example. The second side 3124*b* has a convex arc shape, and is installed on the opposite side of the first side 3124*a* with the first extension part 3122 interposed therebetween. The first side 3124*a* and the second side 3124*b* have a relationship that forms the same arc when they are each extended. The third side 3124*c* has a concave arc shape. The third side 3124*c* is installed near the groove part 27 with respect to the first side 3124*a* and the second side 3124*b*.

As illustrated in FIG. 20, the main surface sixth part 316 includes a pad part 3161, a first extension part 3162, a second extension part 3163, and an edge part 3164.

The first wire 418, the second wire 428, and the third wire 438 are connected to the pad part 3161. The pad part 3161 includes a first side 3161*a*, a second side 3161*b*, a third side 3161*c*, a fourth side 3161*d*, a fifth side 3161*e*, a sixth side 3161*f*, a seventh side 3161*g*, an eighth side 3161*h*, a ninth side 3161*i*, a tenth side 3161*j*, an eleventh side 3161*k*, a twelfth side 3161*l*, and a thirteenth side 3161*m*.

The first side 3161*a* has a shape along the x direction. The second side 3161*b* has a shape along the x direction. The second side 3161*b* is located on one side of the first side 3161*a* in they direction. The third side 3161*c* has a shape along the x direction. The third side 3161*c* is located on one side of the first side 3161*a* in the x direction and on the other side thereof in they direction. The fourth side 3161*d* has a shape along the x direction. The fourth side 3161*d* is located on one side of the third side 3161*c* in they direction. Also, the fourth side 3161*d* is located on one side of the second side 3161*b* in the x direction, and thus has substantially the same position in the y direction.

The fifth side 3161*e* has a shape along they direction. The fifth side 3161*e* is located between the first side 3161*a* and the second side 3161*b* in they direction. The sixth side 3161*f* has a shape along they direction. The sixth side 3161*f* is located between the first side 3161*a* and the third side 3161*c* in the x direction and they direction. The seventh side 3161*g* has a shape along they direction. The seventh side 3161*g* is located between the third side 3161*c* and the fourth side 3161*d* in the y direction.

The eighth side 3161*h* is interposed between the fifth side 3161*e* and the first side 3161*a*, and connects them. In the illustrated example, the eighth side 3161*h* has a convex curve shape. The ninth side 3161*i* is interposed between the first side 3161*a* and the sixth side 3161*f*, and connects them. In the illustrated example, the ninth side 3161*i* has a concave curve shape. The tenth side 3161*j* is interposed between the sixth side 3161*f* and the third side 3161*c*, and connects them. In the illustrated example, the tenth side 3161*j* has a convex curve shape. The eleventh side 3161*k* is interposed between the third side 3161*c* and the seventh side 3161*g*, and connects them. In the illustrated example, the eleventh side 3161*k* has a convex curve shape. The twelfth side 3161*l* is interposed between the seventh side 3161*g* and the fourth side 3161*d*, and connects them. In the illustrated example, the twelfth side 3161*l* has a convex curve shape. The thirteenth side 3161*m* is connected to the fifth side 3161*e*. In the illustrated example, the thirteenth side 3161*m* has a concave curve shape.

The first extension part 3162 extends from the pad part 3161 toward the groove part 27. The first extension part 3162 includes a first side 3162*a* and a second side 3162*b*. The first side 3162*a* is connected to the thirteenth side 3161*m* of the pad part 3161, and has a shape along the x direction in the illustrated example. The second side 3162*b* is connected to the second side 3161*b* of the pad part 3161, and has a part along the x direction and a part having a concave curve shape in the illustrated example.

The second extension part 3163 extends from the pad part 3161 to one side in the y direction, and reaches the end edge (fourth surface 26) of the main surface 21 in they direction. The second extension part 3163 includes a first side 3163*a* and a second side 3163*b*. The first side 3163*a* is connected to the second side 3161*b* of the pad part 3161, and has a concave curve shape in the illustrated example. The second side 3163*b* is connected to the fourth side 3161*d* of the pad part 3161, and has a concave curve shape in the illustrated example.

The edge part 3164 is connected to the first extension part 3162, and has a shape along the groove part 27 of the base 2 as viewed in the z direction. In the illustrated example, the edge part 3164 includes a first side 3164*a*, a second side 3164*b*, and a third side 3164*c*.

The first side 3164*a* has a convex arc shape, and is connected to the second side 3162*b* of the first extension part 3162 in the illustrated example. The second side 3164*b* has a convex arc shape, and is installed on the opposite side of the first side 3164*a* with the first extension part 3122 interposed therebetween. The first side 3164*a* and the second side 3164*b* have a relationship that forms the same arc when they are each extended. The third side 3164*c* has a concave arc shape. The third side 3164*c* is installed near the groove part 27 with respect to the first side 3164*a* and the second side 3164*b*.

In the present embodiment, the bonding part 4181 of the first wire 418 is arranged between the first side 3161*a* and the second side 3161*b*. Also, the bonding part 4281 is arranged between the sixth side 3161*f* and the seventh side 3161*g*. Further, the bonding part 4381 is arranged on one side of the bonding part 4181 in the x direction and on one side of the bonding part 4281 in the y direction.

Furthermore, in the third semiconductor light-emitting element 43 of the present embodiment, the configuration of the electrode 431 and the electrode 432 is reversed, as compared with the third semiconductor light-emitting element 43 of the semiconductor light-emitting device A1, in which the electrode 431 is an anode electrode and the electrode 432 is a cathode electrode.

Even in the present embodiment, it is possible to promote miniaturization of the semiconductor light-emitting device A3. In addition, according to the present embodiment, the first wires 418, the second wires 428, and the third wire 438 can be connected to the pad part 3161, which is suitable for miniaturization.

The semiconductor light-emitting device according to the present disclosure is not limited to the aforementioned embodiments. The specific configuration of the respective parts of the semiconductor light-emitting device according to the present disclosure may be variously modified in design.

[Supplemental Note 1]

A semiconductor light-emitting device, including:

a substrate having a base and a conductive part;

a first semiconductor light-emitting element, a second semiconductor light-emitting element, and a third semiconductor light-emitting element supported by the substrate;

at least one first wire connected to the first semiconductor light-emitting element, at least one second wire connected to the second semiconductor light-emitting element, and a third wire connected to the third semiconductor light-emitting element; and a light-transmitting resin part covering the first semiconductor light-emitting element, the second semiconductor light-emitting element, and the third semiconductor light-emitting element, wherein the base has a main surface and a rear surface facing opposite sides to each other in a thickness direction of the base, wherein the conductive part includes a main surface part formed on the main surface, wherein the main surface part includes a main surface first part on which the first semiconductor light-emitting element and the second semiconductor light-emitting element are mounted, wherein the main surface first part reaches both ends of the main surface in a first direction perpendicular to the thickness direction of the base, and wherein the main surface first part is separated from both a part of the main surface part on which the third semiconductor light-emitting element is mounted and a part of the main surface part to which the at least one first wire, the at least one second wire, and the third wire are connected.

[Supplemental Note 2]

The device of Supplemental Note 1, wherein the first semiconductor light-emitting element and the second semiconductor light-emitting element are bonded to the main surface first part by an insulating bonding material.

[Supplemental Note 3]

The device of Supplemental Note 2, wherein the third semiconductor light-emitting element is bonded to the main surface part by a conductive bonding material.

[Supplemental Note 4]

The device of Supplemental Note 3, wherein the base has a plurality of groove parts extending in the thickness direction, and wherein the conductive part includes a rear surface part formed on the rear surface, and a plurality of connection parts formed in the groove parts and configured to electrically connect a portion of the main surface part and a portion of the rear surface part.

[Supplemental Note 5]

The device of Supplemental Note 4, wherein the main surface first part is separated from the plurality of connection parts.

[Supplemental Note 6]

The device of Supplemental Note 5, wherein the main surface first part includes:

a first pad part on which the first semiconductor light-emitting element and the second semiconductor light-emitting element are mounted; and a first extension part and a second extension part extending from the first pad part to both ends of the main surface on both sides in the first direction.

[Supplemental Note 7]

The device of Supplemental Note 6, wherein the at least one first wire includes two first wires connected to the first semiconductor light-emitting element; and wherein the at least one second wire includes two second wires connected to the second semiconductor light-emitting element.

[Supplemental Note 8]

The device of Supplemental Note 7, wherein the first semiconductor light-emitting element and the second semiconductor light-emitting element are arranged side by side in the first direction.

[Supplemental Note 9]

The device of Supplemental Note 8, wherein the main surface part includes a main surface second part located on one side of the first semiconductor light-emitting element and the second semiconductor light-emitting element in a second direction perpendicular to the thickness direction and the first direction, and wherein the third semiconductor light-emitting element is mounted on the main surface second part, and one of the first wires and one of the second wires are connected thereto.

[Supplemental Note 10]

The device of Supplemental Note 9, wherein the main surface second part includes:

a second pad part on which the third semiconductor light-emitting element is mounted and to which the one of the first wires and the one of the second wires are connected;

an edge part connected to the connection parts; and a first extension part connected to the second pad part and the edge part.

[Supplemental Note 11]

The device of Supplemental Note 10, wherein the main surface second part includes a second extension part extending from the second pad part to one opposite side of the main surface first part in the second direction.

[Supplemental Note 12]

The device of Supplemental Note 11, wherein the main surface part includes a main surface third part to which the other first wire is connected and a main surface fourth part to which the other second wire is connected.

[Supplemental Note 13]

The device of Supplemental Note 7, wherein the first semiconductor light-emitting element and the second semiconductor light-emitting element are arranged side by side and inclined with respect to the first direction.

[Supplemental Note 14]

The device of Supplemental Note 13, wherein the main surface part includes a main surface second part located on one side of the second semiconductor light-emitting element in a second direction perpendicular to the thickness direction and the first direction, and wherein the third semiconductor light-emitting element is mounted on the main surface second part.

[Supplemental Note 15]

The device of Supplemental Note 14, wherein the main surface part includes a main surface sixth part located on one side of the second semiconductor light-emitting element in the second direction and connected to one of the first wires and one of the second wires.

[Supplemental Note 16]

The device of Supplemental Note 15, wherein the main surface part includes a main surface third part to which the other first wire is connected and a main surface fourth part to which the other second wire is connected.

[Supplemental Note 17]

The device of Supplemental Note 16, wherein the main surface second part and the main surface sixth part are electrically connected to the connection parts different from each other.

According to the present disclosure in some embodiments, it is possible to promote miniaturization of a semiconductor light-emitting device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor light-emitting device, comprising:
   a substrate having a base and a conductive part;
   a first semiconductor light-emitting element, a second semiconductor light-emitting element, and a third semiconductor light-emitting element supported by the substrate;
   at least one first wire connected to the first semiconductor light-emitting element, at least one second wire connected to the second semiconductor light-emitting element, and a third wire connected to the third semiconductor light-emitting element; and
   a light-transmitting resin part covering the first semiconductor light-emitting element, the second semiconductor light-emitting element, and the third semiconductor light-emitting element,
   wherein the base has a main surface and a rear surface facing opposite sides to each other in a thickness direction of the base,
   wherein the conductive part includes a main surface part formed on the main surface,
   wherein the main surface part includes a main surface first part on which the first semiconductor light-emitting element and the second semiconductor light-emitting element are mounted,
   wherein the main surface first part reaches both ends of the main surface in a first direction perpendicular to the thickness direction of the base, and
   wherein the main surface first part is separated from both a part of the main surface part on which the third semiconductor light-emitting element is mounted and a part of the main surface part to which the at least one first wire, the at least one second wire, and the third wire are connected.

2. The device of claim 1, wherein the first semiconductor light-emitting element and the second semiconductor light-emitting element are bonded to the main surface first part by an insulating bonding material.

3. The device of claim 2, wherein the third semiconductor light-emitting element is bonded to the main surface part by a conductive bonding material.

4. The device of claim 3, wherein the base has a plurality of groove parts extending in the thickness direction, and
   wherein the conductive part includes a rear surface part formed on the rear surface, and a plurality of connection parts formed in the groove parts and configured to electrically connect a portion of the main surface part and a portion of the rear surface part.

5. The device of claim 4, wherein the main surface first part is separated from the plurality of connection parts.

6. The device of claim 5, wherein the main surface first part includes:
   a first pad part on which the first semiconductor light-emitting element and the second semiconductor light-emitting element are mounted; and
   a first extension part and a second extension part extending from the first pad part to both ends of the main surface on both sides in the first direction.

7. The device of claim 6, wherein the at least one first wire includes two first wires connected to the first semiconductor light-emitting element; and
   wherein the at least one second wire includes two second wires connected to the second semiconductor light-emitting element.

8. The device of claim 7, wherein the first semiconductor light-emitting element and the second semiconductor light-emitting element are arranged side by side in the first direction.

9. The device of claim 8, wherein the main surface part includes a main surface second part located on one side of the first semiconductor light-emitting element and the second semiconductor light-emitting element in a second direction perpendicular to the thickness direction and the first direction, and
   wherein the third semiconductor light-emitting element is mounted on the main surface second part, and one of the first wires and one of the second wires are connected thereto.

10. The device of claim 9, wherein the main surface second part includes:
    a second pad part on which the third semiconductor light-emitting element is mounted and to which the one of the first wires and the one of the second wires are connected;
    an edge part connected to the connection parts; and
    a first extension part connected to the second pad part and the edge part.

11. The device of claim 10, wherein the main surface second part includes a second extension part extending from the second pad part to one opposite side of the main surface first part in the second direction.

12. The device of claim 11, wherein the main surface part includes a main surface third part to which the other first wire is connected and a main surface fourth part to which the other second wire is connected.

13. The device of claim 7, wherein the first semiconductor light-emitting element and the second semiconductor light-emitting element are arranged side by side and inclined with respect to the first direction.

14. The device of claim 13, wherein the main surface part includes a main surface second part located on one side of the second semiconductor light-emitting element in a second direction perpendicular to the thickness direction and the first direction, and wherein the third semiconductor light-emitting element is mounted on the main surface second part.

15. The device of claim 14, wherein the main surface part includes a main surface sixth part located on one side of the second semiconductor light-emitting element in the second direction and connected to one of the first wires and one of the second wires.

16. The device of claim 15, wherein the main surface part includes a main surface third part to which the other first wire is connected and a main surface fourth part to which the other second wire is connected.

17. The device of claim 16, wherein the main surface second part and the main surface sixth part are electrically connected to the connection parts different from each other.

* * * * *